US012693168B2

(12) United States Patent
Tanaka

(10) Patent No.: US 12,693,168 B2
(45) Date of Patent: Jul. 28, 2026

(54) BOLOMETER AND METHOD FOR MANUFACTURING THE SAME

(71) Applicant: NEC Corporation, Tokyo (JP)

(72) Inventor: Tomo Tanaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 256 days.

(21) Appl. No.: 18/533,426

(22) Filed: Dec. 8, 2023

(65) Prior Publication Data

US 2024/0210247 A1 Jun. 27, 2024

(30) Foreign Application Priority Data

Dec. 15, 2022 (JP) ................................ 2022-200017

(51) Int. Cl.
*G01J 5/10* (2006.01)
*H10N 15/10* (2023.01)

(52) U.S. Cl.
CPC ................ *G01J 5/10* (2013.01); *H10N 15/15* (2023.02); *G01J 2005/106* (2013.01)

(58) Field of Classification Search
None
See application file for complete search history.

(56) References Cited

U.S. PATENT DOCUMENTS 5,879,808 A * 3/1999 Wary ........................ B05D 1/60 428/447
2013/0002394 A1* 1/2013 Narita ........................ G01J 5/20 29/610.1
2016/0176703 A1* 6/2016 Baillin .................. B81B 7/0038 216/72

FOREIGN PATENT DOCUMENTS

JP 2007-263769 A 10/2007
JP 2010-131744 A 6/2010
WO 2018/207815 A1 11/2018

* cited by examiner

*Primary Examiner* — Marcus H Taningco
(74) *Attorney, Agent, or Firm* — Sughrue Mion, PLLC

(57) ABSTRACT

A flexible and high-performance bolometer and a method for manufacturing the same are disclosed. The bolometer has (a) a light detector including a bolometer film, and (b) a resin exterior enclosing the light detector; the resin exterior including (b1) a base material layer formed of a resin having a thermal conductivity of 0.3 W/mK or less, and (b2) a protective layer formed of a resin having a thermal conductivity of 0.3 W/mK or less and an infrared transmittance of 70% or more.

10 Claims, 10 Drawing Sheets

BOLOMETER AND METHOD FOR MANUFACTURING THE SAME

This application is based upon and claims the benefit of priority from Japanese patent application No. 2022-200017, filed on Dec. 15, 2022, the disclosure of which is incorporated herein in its entirety by reference.

TECHNICAL FIELD

The present invention relates to a bolometer and a method for manufacturing the same.

BACKGROUND ART

Infrared sensors have a very wide range of applications such as not only monitoring cameras for security, but also thermography for human body, in-vehicle cameras, and inspection of structures, foods, and the like, and are thus actively used in industrial applications in recent years. In particular, development of a low-cost and high-performance infrared sensor capable of obtaining biological information in cooperation with IoT (Internet of Thing) is expected.

As an infrared sensor, a bolometer-type uncooled infrared sensor using a titanium film or vanadium oxide as a resistance material is known. A MEMS structure is used for high performance uncooled bolometers. For example, the bolometer described in Patent Document 1 has a diaphragm-type heat insulating part 204 on a silicon substrate 201 that is isolated from the silicon substrate 201 with a gap 207 supported by legs 242, and has an infrared detection section 203 on the heat insulating part 204 (see FIGS. 19A and 19B). When infrared rays are irradiated, the infrared detection section 203 is heated and detects resistance changes due to temperature changes. The gap 207 is in a vacuum state (vacuum insulation) to prevent heat from being transferred to the silicon substrate 201 by thermal conduction of air.

On the other hand, Patent Document 2 proposes removing a considerable thickness of the silicon substrate in a flexible transducer unit whose main structure is a metal mesh manufactured by a CMOS process. Further, Patent Document 3 proposes a terahertz wave detection device using a carbon nanotube film, and describes the use of a flexible support substrate such as a polyimide film.

CITATION LIST

Patent Literature

Patent Document 1: Japanese Patent Laid-Open No. 2007-263769

Patent Document 2: Japanese Patent Laid-Open No. 2010-131744

Patent Document 3: WO 2018/207815

SUMMARY OF INVENTION

Technical Problem

The fine structure for vacuum insulation as described in Patent Document 1 is weak against bending, and there is a problem in that it is difficult to apply it to flexible devices. On the other hand, in the flexible converter unit described in Patent Document 2, a portion of the silicon substrate remains, and therefore there is still room for improvement in flexibility when used as a flexible device. Further, in a laminated structure such as the terahertz wave detection device described in Patent Document 3, there is room for improvement in stability and durability as a flexible device.

The present invention has been made in view of the above problems, and an object of the present invention is to provide a flexible and high-performance bolometer and a method for manufacturing the same.

Solution to Problem

One aspect of the present invention relates to a bolometer comprising (a) a light detection section (i.e. light detector) including a bolometer film, and (b) a resin exterior enclosing the light detection section (i.e. light detector); the resin exterior including (b1) a base material layer formed of a resin having a thermal conductivity of 0.3 W/mK or less, and (b2) a protective layer formed of a resin having a thermal conductivity of 0.3 W/mK or less and an infrared transmittance of 70% or more.

Another aspect of the present invention relates to a method of manufacturing a bolometer comprising:

forming a base material layer by a resin having a thermal conductivity of 0.3 W/mK or less;

forming a bolometer film on the base material layer;

forming two electrodes so as to be connected to the bolometer film to form a light detection section (i.e. light detector) including the bolometer film and the electrodes;

forming a protective layer having a thermal conductivity of 0.3 W/mK or less and an infrared transmittance of 70% or more in such a manner that the protective layer covers the light detection section (i.e. light detector) and bonds directly to the base material layer around the light detection section (i.e. light detector), whereby the base material layer and the protective layer together form a resin exterior enclosing the light detection section (i.e. light detector).

Advantageous Effect of Invention

According to the present invention, a high-performance flexible bolometer can be provided.

DESCRIPTION OF EMBODIMENTS

Figure 1:
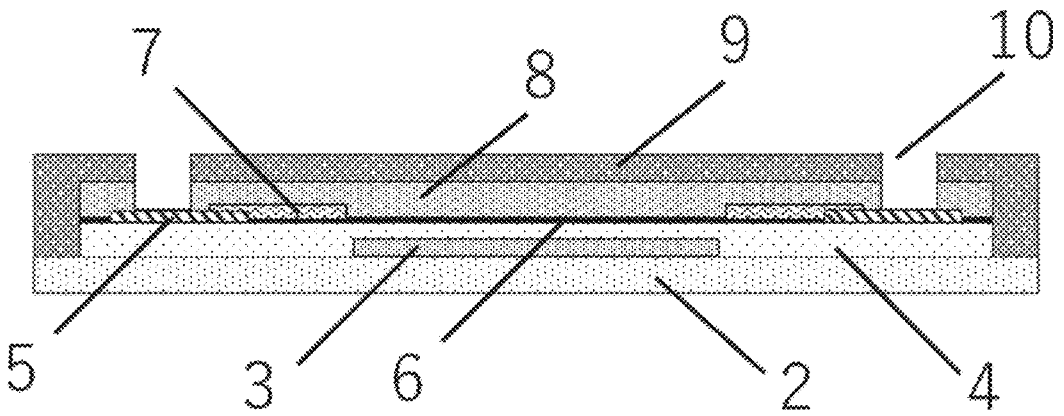
FIG. 1 is a sectional view schematically showing an example of the structure of a bolometer according to an embodiment of the present invention.

FIG. 1 shows a bolometer of an embodiment of the present invention.

The bolometer of the present embodiment includes a base material layer 2 (b1) made of a resin with high heat insulation properties; a light detection section (a) comprising a bolometer film 6 and two contact electrodes 7 provided to be connected to the bolometer film; and a protective layer 9 (b2) made of a resin having high heat insulation properties and high light transmittance. The base material layer 2 and the protective layer 9 are provided to sandwich the light detection section and are bonded to each other around the light detection section to form a resin exterior (resin film) (b) that encloses, namely encapsulate, the light detection section. Namely, the bolometer of the present embodiment has a structure in which the light detection section is enclosed in the resin exterior comprising the base material layer 2 and the protective layer 9. Since the element is protected by this structure, a high-performance bolometer can be realized.

Further, the bolometer of the present embodiment is useful as a flexible bolometer because the substrate (base material layer 2) is made of flexible resin and does not include a rigid substrate such as a Si substrate. Flexible bolometers are required to have bending resistance and durability. In the bolometer of the present embodiment, since the light detection section is protected by the resin exterior made of the base material layer 2 and the protective layer 9, it is possible to realize a high-performance bolometer in which connection failures due to bending of the element are less likely to occur, and has high bending resistance and durability.

Further, in one embodiment, the light detection section and the resin exterior surrounding the light detection section are in close contact with each other. This makes it possible to further reduce connection failures and further improve bending resistance and durability.

As described above, the light detecting section comprises a bolometer film. The term "light detecting section" may be referred to as "light detector", and is not limited to structures described in the present specification. In the present specification, however, the term "light detecting section" is mainly used. In the present specification, "a portion including the bolometer film 6 and the contact electrode 7", which is a representative embodiment of a light detecting section, may be referred to as a light detecting section. As shown in FIG. 1, the bolometer of the present embodiment may include, in addition to a bolometer film 6 and contact electrodes 7, additional components such as a mirror 3, an under layer 4 formed under the bolometer film 6, a light absorption film 8, wiring 5 connected to the contact electrodes 7. In the present specification, the light detection section and these additional components may be collectively referred to as an element section.

In the present specification, when a bolometer includes an additional component in addition to the light detection section, the term "light detection section" may be read as "element part" in terms of expressions such as "the light detection section is wrapped in a resin exterior". Namely, for example, the embodiment in which "the element part is wrapped in a resin exterior" is also disclosed in the present specification.

In one embodiment, the components constituting the element part are stacked in close contact with each other.

Each component of the bolometer of the present embodiment will be explained with reference to the drawings, along with an example of the manufacturing process of the bolometer of the present invention.

Step 1. Process of Providing a Support

Figure 2:
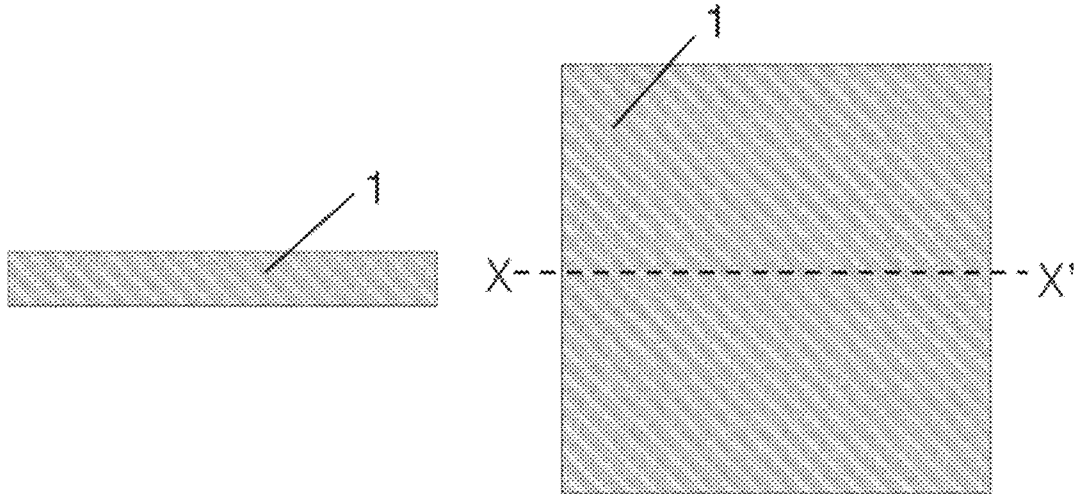
FIG. 2 is a diagram showing one of the steps of a method for manufacturing a bolometer according to an embodiment of the present invention (right: top view, left: cross-sectional view at position X-X')

First, a support 1 for forming the base material layer 2 is provided (FIG. 2). In FIG. 2, a Si substrate is used as the support 1, but since the support 1 will be removed from the bolometer element later, its material and shape are not particularly limited, but the material of the support is preferably selected so that the base material layer 2 formed thereon can be easily peeled off, and the support preferably has a smooth surface.

It is also preferable to apply a general semiconductor device manufacturing process to the manufacturing of the bolometer of the present embodiment. In this case, a material used for a general substrate (either a flexible substrate or a rigid substrate) may be used as the support.

Examples of materials constituting the support may include, but not limited to, inorganic materials such as Si, Si coated with $SiO_2$, $SiO_2$, SiN, and glass; and organic materials such as polyimide, polyethylene, polypropylene, polystyrene, polyvinyl chloride, polyethylene terephthalate, acrylonitrile styrene resin, acrylonitrile butadiene styrene resin, fluororesin, methacrylic resin, polycarbonate, and the like. Among these, Si substrates are preferred from the viewpoint that semiconductor processes are applicable.

Step 2. Process of Forming a Base Material Layer 2

Figure 3:
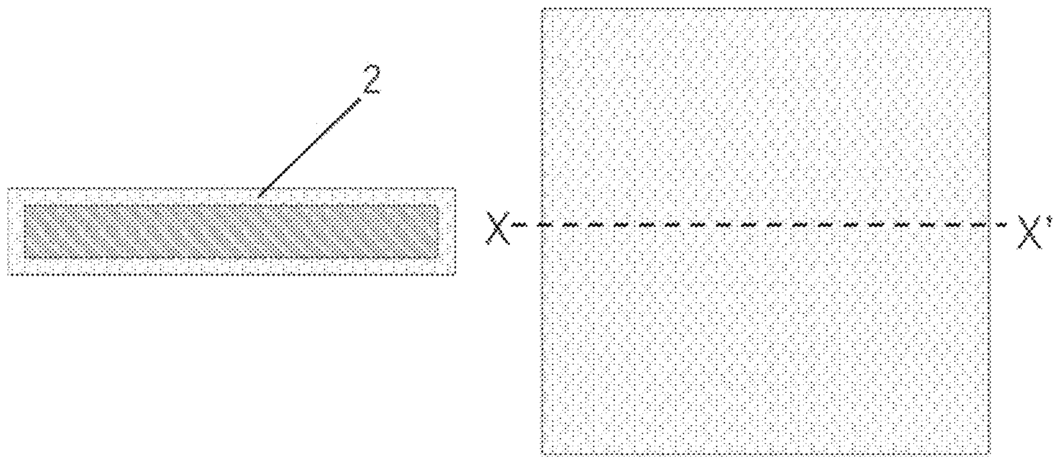
FIG. 3 is a diagram showing one of the steps of a method for manufacturing a bolometer according to an embodiment of the present invention (right: top view, left: cross-sectional view at position X-X')

Next, a base material layer 2 is formed on the support 1 (FIG. 3).

The base material layer 2 is made of resin with high heat insulation properties (low thermal conductivity). By using a resin with high heat insulation properties for the base material layer, heat dissipation from the bolometer film can be suppressed. Furthermore, when the bolometer of the present embodiment is used by being attached to a desired base, heat conduction from the bolometer to the base can be suppressed. Therefore, by using a material with high heat insulation properties for the base material layer, good detection sensitivity can be achieved.

The thermal conductivity of the resin constituting the base material layer is generally 0.3 W/mK or less, preferably 0.15 W/mK or less, and more preferably 0.1 W/mK or less depending on the case. Since a lower thermal conductivity is preferable, the lower limit is not particularly limited, but is, for example, 0.02 W/mK or more, for example, 0.05 W/mK or more. In particular, it is preferable that the thermal conductivity of the base material layer in the direction perpendicular to the layer surface (layer forming direction) is at least within the above range.

Thermal conductivity can be measured using the 3-omega method, which measures the thermal conductivity in the thickness direction of a thin film. The measurement of thermal conductivity using the 3-omega method may be carried out by referring, for example, "Guermoudi et al., Thermal conductivity and interfacial effect of parylene C thin film using the 3-omega method (Journal of Thermal Analysis and Calorimetry (2021) 145:1-12)" and calculating the thermal conductivity $k_i$ (Intrinsic thermal conductivity). This document is hereby incorporated by reference in its entirety.

Further, the thermal conductivity may be a value determined at 25° C. according to a standard method (ASTM C177, ASTM E1461, etc.).

Moreover, since the bolometer of the present embodiment is suitable for a flexible bolometer, it is preferable that the base material layer 2 has appropriate flexibility. The base material layer 2 preferably has flexibility comparable to each component laminated on the base material layer 2. For example, at least the base material layer 4 must be able to bend without cracking to the radius of curvature that causes cracks to the under layer (silicon oxide, etc.), that is, it must have at least the same or higher bending resistance as the under layer.

For example, the base material layer 2 is preferably able to bend without cracking to a radius of curvature of up to 10 mm, preferably up to 5 mm, at room temperature (23° C.), air atmosphere, atmospheric pressure, and environmental humidity (RH 30 to 70%) at a desired thickness used in a bolometer. The flexibility of the base material layer 2 may be evaluated in a state that the base material layer 2 is stacked or laminated with other components as a bolometer element, or may be evaluated using a sample made of the resin that constitutes the base material layer 2.

Further, from the viewpoint of flexibility as a bolometer element, the Young's modulus of the resin constituting the base material layer 2 is preferably 10 GPa or less, more preferably 5 GPa or less. In addition, from the viewpoint of supportability as a substrate for a bolometer element, it is preferably 1 GPa or more, and more preferably 3 GPa or more.

Young's modulus can be estimated by a tensile test. A tensile test was conducted under the condition that the nominal strain rate obtained by dividing the crosshead speed during the test by the initial length (distance between chucks) was 0.1 $min^{-1}$, and the initial slope of the nominal stress-nominal strain curve is determined as Young's modulus. Young's modulus can be measured under standard conditions in the atmosphere (for example, in the atmosphere at 23° C. and 50 RH).

The thickness of the base material layer may be appropriately set in consideration of the resin components used, but is preferably 100 nm or more, more preferably 1 μm or more, even more preferably 30 μm or more, and preferably 200 μm or less, and more preferably 100 μm or less. When the thickness of the base material layer is within the above range, sufficient heat insulation properties can be obtained and flexibility suitable for a flexible bolometer can be obtained.

Although the resin used for such a base material layer is not particularly limited, parylene can be mentioned. Parylene is a general term for paraxylylene polymers, and has a structure in which benzene rings are connected via $CH_2$. Examples of parylenes include those formed from dimers represented by the following formula:

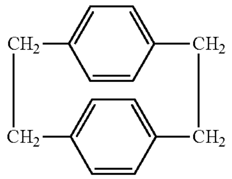 [SMILES: c1cc2ccc1CCc1ccc(cc1)CC2]

(In the formula, at least one hydrogen atom of at least one benzene ring may be substituted with a halogen atom. Halogen includes fluorine (F), chlorine (Cl), bromine (Br), iodine (I), and is preferably chlorine. In the formula, the number of substitutions by halogen is 8 or less, preferably 6 or less, and more preferably 4 or less.)

Parylene includes parylene N, parylene C, parylene D, parylene HT, ParyFree and the like, and among them, parylene C (heat conductivity: 0.084 (W/mK)) having the lowest heat conductivity is suitable.

The manufacturing method of the heat insulating layer is not particularly limited, and can be selected as appropriate depending on the resin used. For example, when parylene is used, a parylene film can be formed by coating the support 1 with parylene using a vacuum evaporation device. Specifically, when a solid dimer is heated under vacuum, it vaporizes and becomes a dimer gas. This gas is thermally decomposed, allowing the dimer to cleave into monomer form. In the vapor deposition chamber at room temperature, this monomer gas polymerizes on all surfaces to form a thin, transparent polymer film. If necessary, before performing the vapor deposition process, the support 1 may be pretreated, cleaned, and areas not to be vapor deposited may be masked.

Step 3. Process of Forming a Mirror (Light Reflection Layer)

Figure 4:
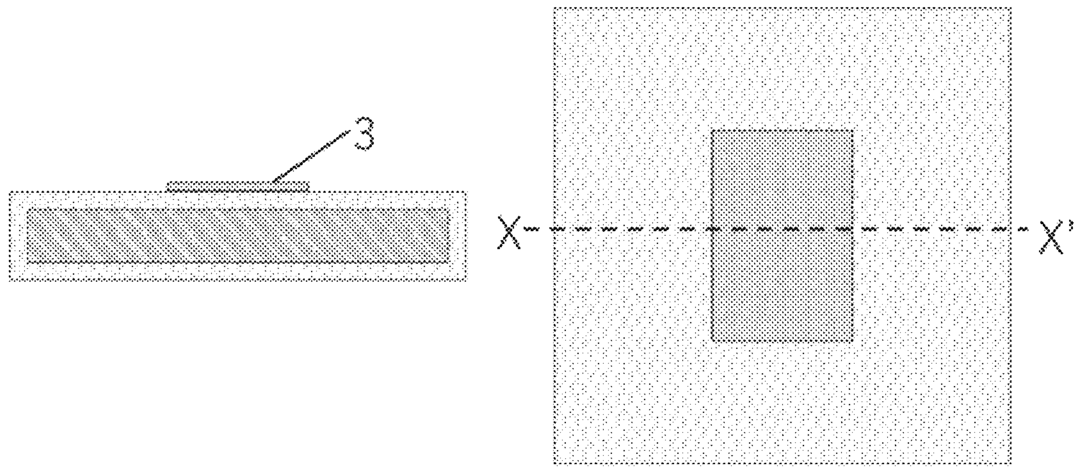
FIG. 4 is a diagram showing one of the steps of a method for manufacturing a bolometer according to an embodiment of the present invention (right: top view, left: cross-sectional view at position X-X')

A mirror (light reflecting layer) 3 may be provided on the base material layer 2 to improve the absorption rate of light to be detected (FIG. 4).

The mirror is a layer that reflects light that has passed through the bolometer film 6 without being absorbed, and causes the bolometer film 6 to reabsorb the light. Therefore, the mirror is provided on the side opposite to the incident side of light with respect to the bolometer film. In addition, in FIG. 4, the mirror 3 is formed directly above the base material layer 2 (between the base material layer 2 and the under layer 4), but the mirror 3 may be provided within the base material layer 2, or it may be provided within the under layer 4.

As the mirror, any material used as a light reflecting layer in a bolometer can be used without any restriction, and metals such as titanium, gold, silver, aluminum, and the like are generally used, and the mirror can be formed by vapor deposition, sputtering, plating, and the like. Although the thickness of the mirror is not particularly limited, it is preferably 0.1 μm or more, and in order to achieve appropriate flexibility as a flexible element, it is preferably 5 μm or less, more preferably 1 μm or less.

Step 4. Process of Forming an Under Layer

Figure 5:
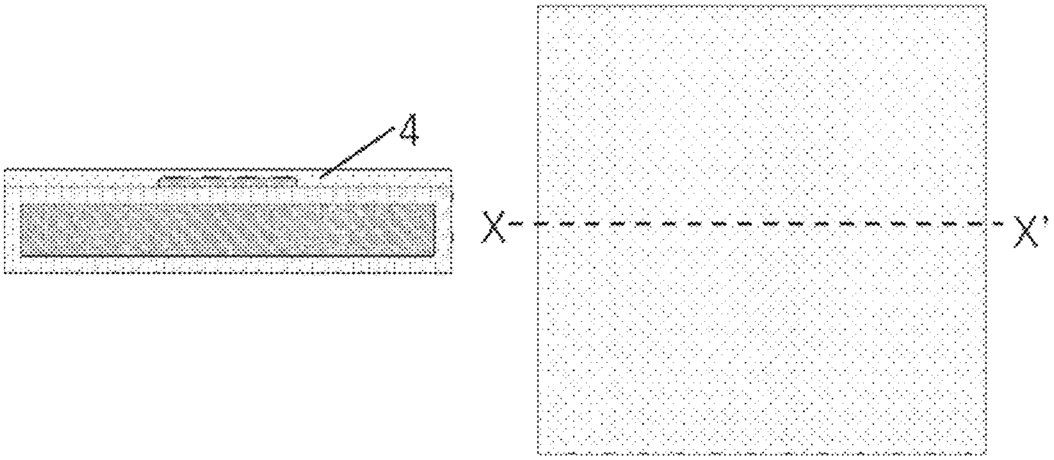
FIG. 5 is a diagram showing one of the steps of a method for manufacturing a bolometer according to an embodiment of the present invention (right: top view, left: cross-sectional view at position X-X')

On the base material layer 2 and below the bolometer film 6, an optional layer, which may be referred to as an under layer 4, may be provided as necessary (FIG. 5). For example, when using a carbon nanotube layer as the bolometer film, a layer for dispersing carbon nanotubes (a layer on which a carbon nanotube dispersion liquid is applied, to be described later) may be provided on the base material layer 2. In one embodiment, a layer capable of absorbing light may also be provided. In one embodiment, the layer for carbon nanotube dispersion may also have a function of absorbing light. In the present specification, any layer provided under the bolometer film may be referred to as a under layer. The under layer may be an insulating layer.

The material of the under layer is not particularly limited, but in order to make a flexible bolometer, it is preferably a flexible material, the examples of which include silicon oxide ($SiO_2$), silicon nitride film (SiN), and the like.

Step 5. Process of Forming a Wiring

Figure 6:
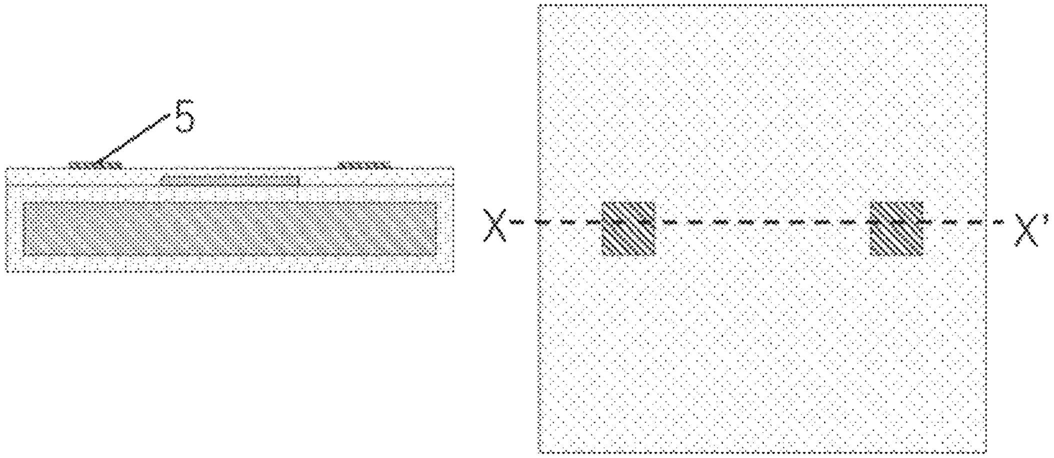
FIG. 6 is a diagram showing one of the steps of a method for manufacturing a bolometer according to an embodiment of the present invention (right: top view, left: cross-sectional view at position X-X')

A wiring 5 connected to the contact electrodes 7 may be provided on the under layer 4 (FIG. 6).

The wiring 5 may be made of the same material as the contact electrode, or may be made of a different material. For example, titanium, gold, aluminum, copper, tungsten, cobalt, or alloys containing one or more of these may be used. Two or more metals may be used in combination, for example, depositing gold on titanium, in consideration of the adhesion/bonding characteristics with the base material (under layer 4 in case of FIG. 6) and with the contact electrode/bolometer film. The wiring can be formed by vapor deposition or printing after patterning using a metal mask or the like if necessary.

Step 6. Process of Forming a Bolometer Film

Figure 7:
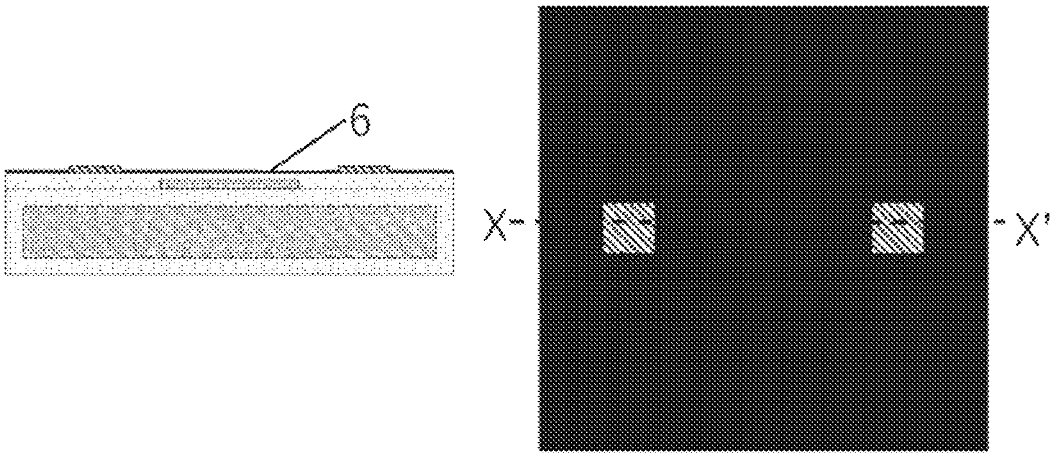
FIG. 7 is a diagram showing one of the steps of a method for manufacturing a bolometer according to an embodiment of the present invention (right: top view, left: cross-sectional view at position X-X')

A bolometer film 6 is formed on the under layer 4 (FIG. 7).

(6-1) Surface Treatment

The surface of the under layer 4 on which the bolometer film is formed may be subjected to a surface treatment to improve adhesion to the bolometer film.

The material used for the surface treatment is preferably a material that has both a moiety that is highly adhesive to the base material (under layer 4) on which the bolometer film is to be formed and a moiety that is highly adhesive to the bolometer film. Such materials are not particularly limited, but when using a carbon nanotube film to be described later as a bolometer film, examples thereof include a silane coupling agent (aminosilane compound) having an amino group which has high affinity to carbon nanotubes and an alkoxysilyl group. Examples of the aminosilane compound include 3-aminopropyltriethoxysilane (APTES).

(6-2) Bolometer Film

The bolometer of the present embodiment can be used to detect desired electromagnetic waves. For the bolometer film 6, a thermoelectric conversion material may be appropriately selected and used according to the electromagnetic waves to be detected.

Examples of materials for the bolometer film include, but are not limited to, titanium films, vanadium oxide films, and organic thin films using organic materials (for example, carbon nanotube films, carbon nanohorn films, carbon nanobrush films).

Details of a bolometer film using carbon nanotubes, which is an example of a preferable bolometer film, and a method for manufacturing the same will be described later.

Step 7. Process of Forming Contact Electrodes

Figure 8:
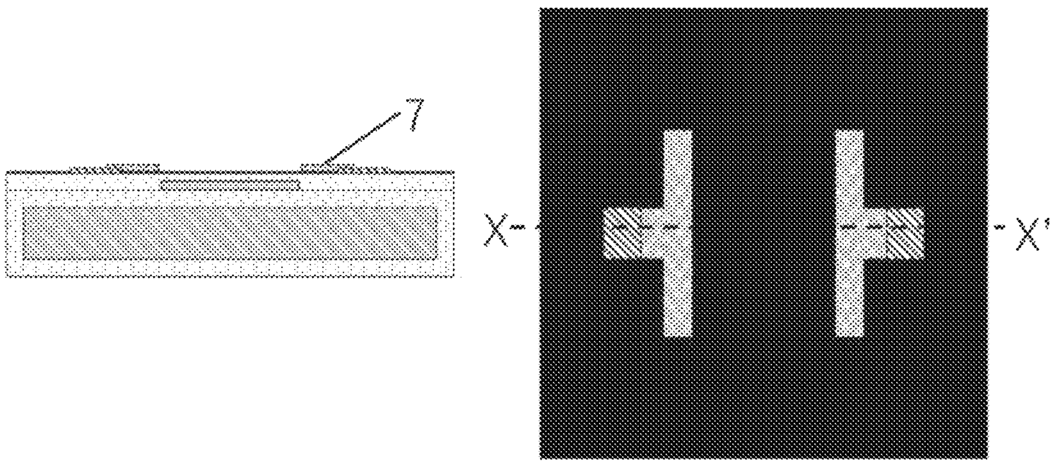
FIG. 8 is a diagram showing one of the steps of a method for manufacturing a bolometer according to an embodiment of the present invention (right: top view, left: cross-sectional view at position X-X')

Contact electrodes 7 are formed so as to be connected to the bolometer film 6 (FIG. 8).

The contact electrodes 7 may be formed on the bolometer film 6 as shown in FIG. 8, or may be formed under the bolometer film 6. When the wiring 5 is provided, the contact electrodes 7 are formed so as to be connected to the bolometer film 6 and the wiring 5.

The thickness of the contact electrode can be adjusted as appropriate, but is preferably 10 nm to 1 mm, more preferably 50 nm to 1 μm. Further, the distance between the electrodes is preferably 1 μm to 500 μm, and more preferably 5 to 200 μm for miniaturization.

Figure 9:
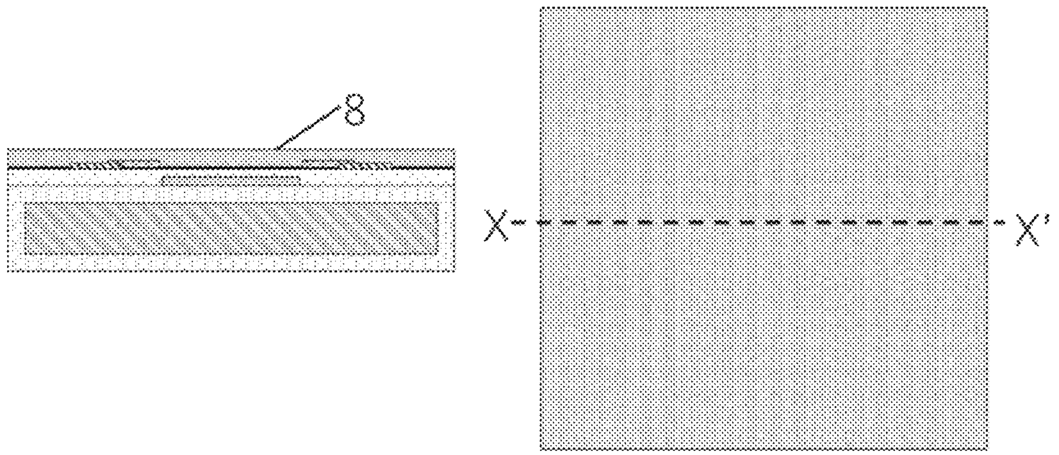
FIG. 9 is a diagram showing one of the steps of a method for manufacturing a bolometer according to an embodiment of the present invention (right: top view, left: cross-sectional view at position X-X')

The material of the contact electrode may be selected as appropriate, taking into account adhesive properties and the characteristics of the bond formed with the bolometer film. For example, single metals such as gold, platinum, titanium, aluminum, copper, and silver or alloys containing at least one of these can be used alone or in combination. The electrode can be formed by, for example, vapor deposition, sputtering, or printing, although the method for producing the electrode is not particularly limited. If necessary, masking may be performed in advance to cover areas where contact electrodes are not to be formed Step 8. Process of Forming a Light Absorption Film and/or a Protective Film A light absorption film and/or a protective film 8 may be provided on the bolometer film 6 (FIG. 9).

Light Absorption Film

The light absorption film has the effect of improving the absorption rate of electromagnetic waves. The light absorption film can be provided on the surface side of the bolometer film 6 on which the electromagnetic waves to be detected are incident.

The thickness of the light absorption film can be set appropriately depending on the material, and can be set to, for example, 50 nm to 1 μm.

As the light-absorbing film, materials used generally as light-absorbing films in bolometers can be used without particular restrictions, such as polyimide coating films, titanium nitride thin films, silicon nitride (SiN) films, silicon oxide ($SiO_2$) films, and the like.

Protective Layer

The protective film has the effect of suppressing doping of the bolometer film due to adsorption of oxygen and the like.

The protective layer can be made of without restriction any material used as a protective layer in a bolometer, and is preferably a material having high transparency in the range of wavelengths to be detected. Examples of the material include, but not limited to, silicon nitride, silicon oxide, as well as acrylic resins such as PMMA and PMMA anisole, epoxy resins, Teflon (Trade Mark) and the like. The thickness of the protective layer can, for example, range from 5 nm to 50 nm depending on the material.

It is also preferable to use a material that functions as a protective film and a light absorption film. As such a material, silicon nitride (SiN) and silicon oxide ($SiO_2$) are preferable.

Figure 10:
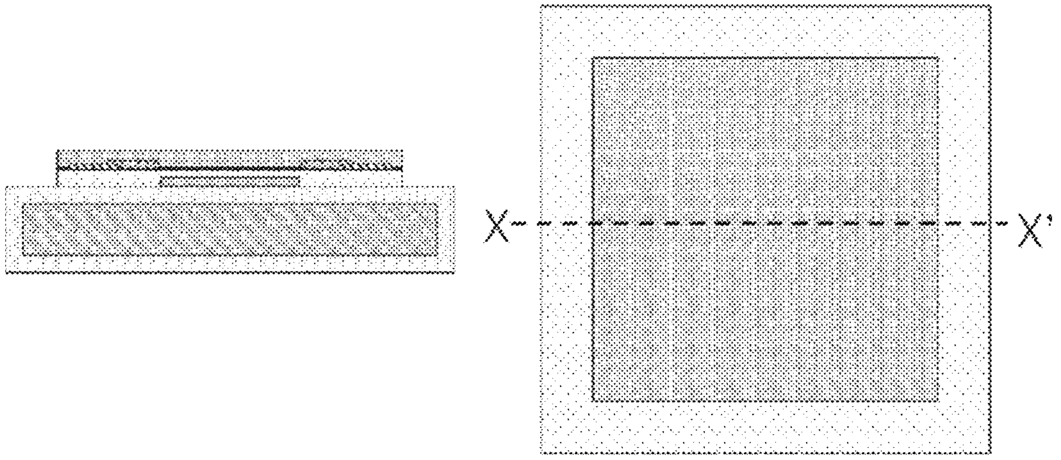
FIG. 10 is a diagram showing one of the steps of a method for manufacturing a bolometer according to an embodiment of the present invention (right: top view, left: cross-sectional view at position X-X')

Step 9. Process of Exposing the Base Material Layer Around the Light Detection Section (FIG. 10)

Through the above steps, a structure in which the mirror 3, the under layer 4, the wiring 5, the bolometer film 6, and the light absorption film/protection film 8 are stacked on the base material layer 2 is formed. In the bolometer of the present embodiment, the base material layer 2 and the protective layer 9 to be formed after bond to each other at the periphery of the light detection section (if other components such as the under layer 4 are included, the light detection section refers to the element portion including them), and form a structure enclosing the light detection section. Therefore, in this step, the light absorption film/protective film 8, bolometer film 6, under layer 4, and the like around the area of the light detection section are removed to expose the base material layer 2 so that the base material layer 2 and the protective layer 9 to be formed later come into direct contact with each other (FIG. 10). The method of exposing the base material layer 2 is not particularly limited, but examples include methods of etching (dry etching, wet etching, etc.) and mechanical removal (dicing, drill, and the like.) to the depth of the surface of the base material layer 2. From the viewpoint of processing precision, dry etching, particularly anisotropic dry etching such as reactive ion etching (RIE), is preferable. When performing etching, an etching mask may be formed in advance on a region to be protected from etching, if necessary. Methods for forming the etching mask include, but are not particularly limited to, a method of forming a mask pattern using metal such as gold by photolithography, a method of forming a mask pattern using photoresist, and the like.

In the present specification, the region of the light detection section refers to the region in the top view of the bolometer element, where the light detection section comprising the bolometer film and the contact electrode (including other components such as the under layer 4, if they exist) occupies.

Step 10. Process of Forming a Protective Film

Figure 11:
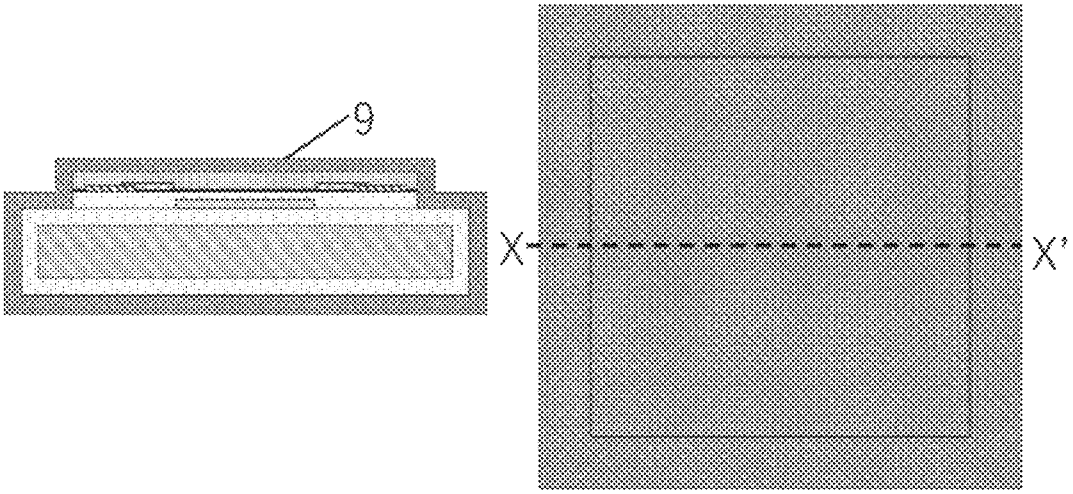
FIG. 11 is a diagram showing one of the steps of a method for manufacturing a bolometer according to an embodiment of the present invention (right: top view, left: cross-sectional view at position X-X')

Next, a protective film is formed (FIG. 11).

The protective layer 9 is formed to cover the area of the light detection section and the area of the base material layer 2 exposed around the area. As a result, the light detection section is wrapped and enclosed in the resin exterior formed by the base material layer 2 and the protective layer 9. This allows a high-performance flexible bolometer to be obtained.

The protective layer 9 is preferably made of a resin with high light transmittance so as not to inhibit the transmission of electromagnetic waves to be detected.

Specifically, a resin having an infrared transmittance of preferably 70% or more, more preferably 80% or more is preferred.

The infrared transmittance of the protective layer 9 can be measured using a resin sample with a desired thickness used in a bolometer, and using, for example, a known ultraviolet-visible near-infrared spectrophotometer (for example, a Fourier transform infrared spectrometer (JASCO Corporation, FT/IR-4000, 6000 series, and the like)).

As the infrared transmittance, the average transmittance value in the wavelength range of 8 to 14 μm may be used. The average value can be calculated by measuring the transmittance in a wavelength range of 8 to 14 μm using a transmission method with a resolution of 4 $cm^{-1}$ and 32 integration times, and calculating the average value from the transmittance for every 1 $cm^{-1}$. Alternatively, a value measured at around 10 μm may be used as a representative value.

Further, like the base material layer 2, the protective layer 9 preferably has high heat insulation properties (low thermal conductivity). By using a material with low thermal conductivity also on the upper surface side of the bolometer film as the protective layer 9, it is possible to suppress the heat absorbed inside the element from dissipating into the air.

Regarding the thermal conductivity of the protective layer 9, the values described for the base material layer 2 may be employed.

It is also preferable that the protective layer 9 has the same flexibility as the base material layer 2.

The thickness of the protective layer 9 is preferably 10 nm or more, more preferably 100 nm or more, and preferably 100 μm or less, more preferably 10 μm or less. Within the above range, a high element protection ability can be obtained, and a decrease in the transmittance of the light to be detected can be further suppressed.

Furthermore, in one embodiment, in order to enhance the integrity of the base material layer and the protective layer, it is preferable that the resin forming the base material layer 2 and the resin forming the protective layer 9 are resins having similar physical properties, and more preferably the same resin.

In particular, parylene has both physical properties suitable for the base material layer and physical properties suitable for the protective layer, as described above. Furthermore, polymer deposition of parylene is performed at the molecular level, and the parylene film grows in units of molecules. Therefore, when parylene is used for both the base material layer 2 and the protective layer 9, the parylene film of the protective layer 9 is continuously formed at the molecular level on the parylene film of the base material layer 2, which allows the formation of a resin exterior in which the base material layer 2 and the protective layer 9 are integrated. In addition, parylene coating allows for uniform encapsulation with high adhesion, and the resin exterior of parylene can be formed in close contact with the light detection section, allowing further enhancement of the integration of the light detection section and the resin exterior.

Here, "integration" refers to the adhesion and difficulty of separation between the base material layer and the protective layer, and the adhesion and difficulty of separation between the resin exterior and the light detection section. Moreover, "integrated" means that the base material layer 2 and the protective layer 9 become a combined state to exist as one component, and are not exist as separate components.

Therefore, in a preferred embodiment by this step, the base material layer and the protective layer are integrated to form a closed space, in which the light detection section has been enclosed.

Step 11-1. Process of Forming Contact Holes

Figure 12:
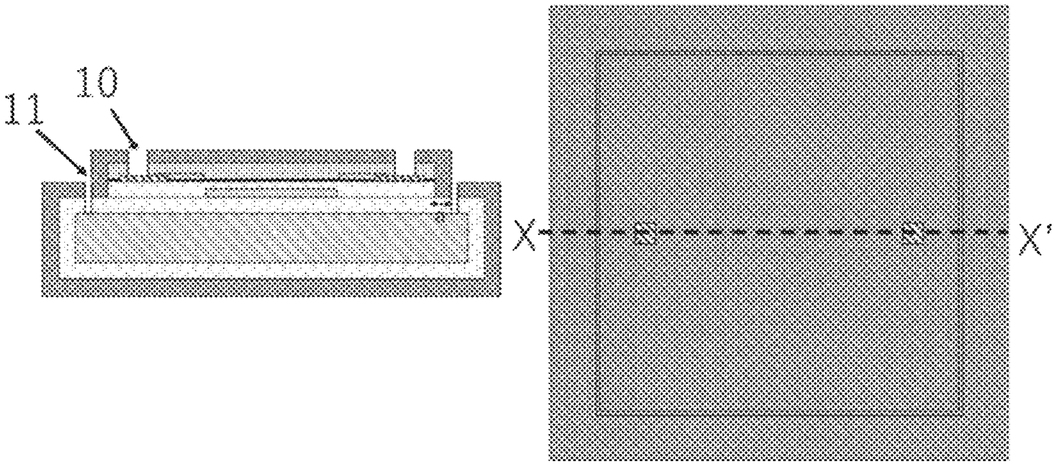
FIG. 12 is a diagram showing one of the steps of a method for manufacturing a bolometer according to an embodiment of the present invention (right: top view, left: cross-sectional view at position X-X')

Through the above steps, a structure in which the light detection section is covered with the base material layer 2 and the protective layer 9 is formed. Next, contact holes 10 for extracting signals are formed (FIG. 12). The contact hole may be formed as an opening for connecting the contact electrode connected to the bolometer film to the outside, or if a wiring is formed to connect to the contact electrode, it may be an opening for connecting the wiring to the outside. Therefore, in a very preferred embodiment, the space formed by the base material layer and the protective layer is a closed space having only openings by contact holes as those breaching a closed space. Namely, in a very preferred embodiment, the resin exterior has openings only at positions of the contact holes.

The shape of the contact hole is not particularly limited, but it is preferably a shape and size that can maintain the protective ability of the resin exterior made of the base material layer 2 and the protective layer 9. The total area of the holes when the element is viewed from above, is preferably 1/10 or less of the surface area of the entire element. Herein, the surface area of the entire device is the area of the entire surface of the resin exterior formed from the base material layer 2 and the protective layer 9 (that is, the total surface area including the top side, bottom side, and side portions of the device). In case that the resin exterior has opening(s) in addition to the contact holes, the sum of the opening is preferably 1/10 or less of the entire surface of the resin exterior.

The method of forming the contact hole is not particularly limited, but may be formed by mechanical removal or etching using the contact electrode or wiring as an etching stop layer.

Step 11-2: Process of Forming a Groove for Peeling Off the Bolometer Element

A groove 11 is formed for peeling off the bolometer element of the present embodiment from the support 1 (FIG. 12). When a resin that is polymerized by vapor deposition, such as parylene, is used as the protective layer 9, the protective layer 9 is formed so as to entirely enclose the support 1, the base material layer 2, and the element portion formed thereon (FIG. 11). Therefore, it is difficult to peel off the bolometer element of the present embodiment from the support 1 at this state. For this reason, a groove 11 is formed to a depth reaching the surface of the support 1 at a position outside of the outer circumference (outer edge) of the light detection section, namely, at the outermost circumference of the bolometer element of the present embodiment. Thereby, the light detection section can be separated from the support 1 while being wrapped in the resin exterior constituted by the base material layer and the protective layer. The groove 11 is formed at a position such that a portion where the base material layer 2 and the protective layer 9 are joined (arrow a in FIG. 12) remains around the light detection section. The width of the joined portion (width a) is not particularly limited, but from the viewpoint of the strength of the resin exterior, it is preferably 0.5 μm or more.

Although the method for forming the groove 11 is not particularly limited, it may be formed by etching or mechanical removal. When a silicon substrate or the like is used as the support 1, the support 1 may be used as an etching stop layer.

Furthermore, the contact hole 10 and the groove 11 may be formed at the same time to simplify the manufacturing process.

Step 12. Process of Peeling Off the Bolometer Element from the Support

Figure 13:
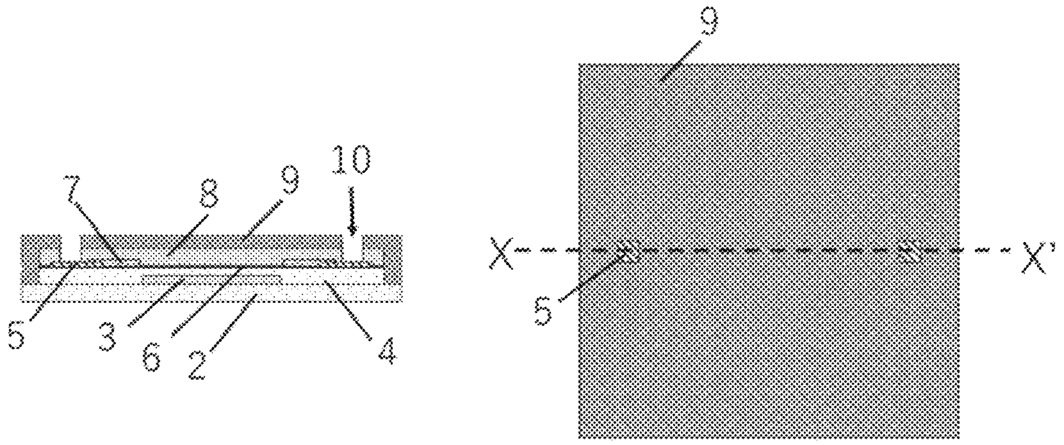
FIG. 13 is a diagram showing one of the steps of a method for manufacturing a bolometer according to an embodiment of the present invention (right: top view, left: cross-sectional view at position X-X')

By forming the groove 11, the bolometer element of the present embodiment is stacked on the support 1 (FIG. 12), so that the bolometer element can be peeled off from the support 1 (FIG. 13).

In a case that an element has a structure in which the light detection section is simply stacked on a support, during the process of peeling the element from the support in this process, stress is applied to the element. This potentially damages the structure of the element, leading to manufacturing defects. Furthermore, in a case that a polymer layer is formed on the back side after removing the substrate, for example as described in Patent Document 2, this also potentially makes a problem that the element structure is easily damaged during the manufacturing process. By contrast, in the bolometer manufacturing method of the present embodiment, since the light detection section is wrapped in a resin exterior constituted by the base material layer 2 and the protective layer 9, the manufacturing defects due to the damage of the element structure caused by peeling stress is reduced, and also durability during use can be improved. Further, in one embodiment, the light detection section and the resin exterior are in close contact with each other. This can further reduce manufacturing defects and further improve durability during use.

In particular, when parylene is used for both the base material layer 2 and the protective layer 9, since the protective layer 9 is continuously formed as a polymer on the base material layer 2, a resin exterior is formed in which the base material layer 2 and the protective layer 9 are completely adhered to each other. Therefore, manufacturing defects during manufacturing can be further reduced, and a bolometer element with higher durability during use can be formed.

Carbon Nanotube Film

A carbon nanotube film will be described in detail below as an example of the bolometer film 6.

A bolometer using a carbon nanotube film can be particularly suitably used to detect electromagnetic waves having a wavelength of 0.7 μm to 1 mm. Electromagnetic waves in this wavelength range include infrared rays and terahertz waves. The bolometer of the present embodiment is preferably an infrared sensor.

The carbon nanotube film as a bolometer film is a thin film composed of a plurality of carbon nanotubes forming conductive paths which electrically connect a pair of contact electrodes. Carbon nanotubes may form structures such as parallel linear, fibrous, and network-like structures, but carbon nanotubes preferably have a three-dimensional network structure because aggregation is less likely to occur and uniform conductive paths can be obtained.

As the carbon nanotubes, single-walled, double-walled, and multi-walled carbon nanotubes may be used, but when semiconducting carbon nanotubes are separated, single-walled or few-walled (for example, double-walled or triple-walled) carbon nanotubes are preferred, and single-walled carbon nanotubes are more preferred. The carbon nanotubes preferably comprise single-walled carbon nanotubes in an amount of 80% by mass or more, and more preferably 90% by mass or more (including 100% by mass).

The diameter of the carbon nanotubes is preferably from 0.6 to 1.5 nm, more preferably 0.6 nm to 1.2 nm, and further preferably 0.7 to 1.1 nm, from the viewpoint of increasing the band gap to improve TCR. In one embodiment, the diameter of 1 nm or less may be particularly preferred in some cases. When the diameter is 0.6 nm or more, the manufacture of carbon nanotubes becomes much easier. When the diameter is 1.5 nm or less, the band gap is easily maintained in an appropriate range and a high TCR can be obtained.

As used herein, the diameter of the carbon nanotubes means that when the carbon nanotubes on the heat insulating layer or the carbon nanotubes formed into a thin film is observed using an atomic force microscope (AFM) and the diameter thereof is measured at about 100 positions, 60% or more in terms of number ratio, preferably 70% or more, optionally preferably 80% or more, more preferably 100% thereof is within a range of 0.6 to 1.5 nm. It is preferred that 60% or more, preferably 70% or more, optionally preferably 80% or more, and more preferably 100% thereof be within a range of 0.6 to 1.2 nm, and further preferably within a range of 0.7 to 1.1 nm. In one embodiment, 60% or more, preferably 70% or more, optionally preferably 80% or more, and more preferably 100% thereof is within a range of 0.6 to 1 nm.

The length of the carbon nanotubes is preferably from 100 nm to 5 μm because dispersion is easy and application properties are excellent. Also, from the viewpoint of conductivity of the carbon nanotubes, the length is preferably 100 nm or more. When the length is 5 μm or less, aggregation on the heat insulating layer and/or at the time of forming a layer is easily suppressed. The length of the carbon nanotubes is more preferably 500 nm to 3 μm, and further preferably 700 nm to 1.5 μm.

As used herein, the length of the carbon nanotubes means that, when at least 100 carbon nanotubes are observed using an atomic force microscope (AFM) and enumerated to measure the distribution of the length of the carbon nanotubes, 60% or more in terms of number ratio, preferably 70% or more, optionally preferably 80% or more, and more preferably 100% thereof is within a range of 100 nm to 5 μm. It is preferred that 60% or more, preferably 70% or more, optionally preferably 80% or more, and more preferably 100% thereof be within a range of 500 nm to 3 μm, and it is more preferred that 60% or more, preferably 70% or more, optionally preferably 80% or more, and more preferably 100% thereof be within a range of 700 nm to 1.5 μm.

When the diameter and length of the carbon nanotubes are within the above range, the influence of semiconductive properties becomes large and a large current value can also be obtained, and thus, a high TCR value is likely to be obtained when the carbon nanotubes are used as a bolometer film.

For the bolometer film, semiconducting carbon nanotubes having a large band gap and carrier mobility are preferably used. The content of the semiconducting carbon nanotubes, preferably single-walled semiconducting carbon nanotubes in carbon nanotubes is generally 67% by mass or more, more preferably 70% by mass or more, particularly preferably 80% by mass or more, and in particular, preferably 90% by mass or more, more preferably 95% by mass or more, and further preferably 99% by mass or more (the upper limit may be 100% by mass). In addition, in the present specification, the ratio (mass %) of semiconducting carbon nanotubes in carbon nanotubes may be described as "semiconductor purity."

The thickness of the bolometer film is not limited, in the range of, for example, 1 nm or more, for example a few nm to 10 μm, preferably 10 nm to 10 μm, more preferably 50 nm to 1 μm. In one embodiment, it is preferably 20 nm to 500 nm, more preferably 50 nm to 200 nm or more.

When the thickness of the bolometer film is 1 nm or more, a good light absorption rate can be achieved.

When the thickness of the carbon nanotube film is 10 nm or more, preferably 50 nm or more, the element structure can be made simpler because an adequate light absorption rate is obtained even without comprising a light reflection layer or a light absorbing material layer.

In addition, from the view point of simplifying the manufacturing method, it is preferred that the thickness of the bolometer film is 1 μm or less, preferably 500 nm or less. Also, when the bolometer film is too thick, the contact electrode that is formed thereon by vapor deposition and the like may not fully contact the carbon nanotubes at the bottom side of the bolometer film, and the effective resistance value becomes higher, but when the thickness is within the above range, increase of the resistance value can be suppressed.

Also, in the case of comprising a mirror (a light reflection layer) or a light absorbing film, it is also possible to make the bolometer film thinner than the above range in order to further simplify the manufacturing process and improve the resistance value.

Also, when the thickness of the bolometer film is in the range of 10 nm to 1 μm as described above, it is also preferable that printing techniques can be suitably applied to the manufacturing method of the bolometer film.

The thickness of the bolometer film can be determined as an average value of the thickness of the carbon nanotube film measured at arbitrary 10 positions.

The density of the bolometer film is, for example, 0.3 $g/cm^3$ or more, preferably 0.8 $g/cm^3$ or more, more preferably 1.1 $g/cm^3$ or more. The upper limit thereof is not particularly limited, but can be the upper limit of the true density of the carbon nanotube used (for example, about 1.4 $g/cm^3$).

When the density of the bolometer film is 0.3 $g/cm^3$ or more, a good light absorbing rate can be achieved.

When the density of the bolometer film is 0.5 $g/cm^3$ or more, it is preferred that the element structure can be simplified because an adequate light absorption rate is obtained even without comprising a mirror (a light reflection layer) or a light absorbing film.

Also, when a mirror (a light reflection layer) or a light absorbing film is comprised, the density of the bolometer film of lower than the above-described density may be appropriately employed.

The density of the bolometer film can be calculated from weight, area, and the thickness obtained as above of the carbon nanotube film.

In addition to the above-mentioned components described above, negative thermal expansion materials described later, ionic conductors (surfactants, ammonium salts, inorganic salts), resins, organic binding agents, and the like may also be appropriately used in the bolometer film.

The content of carbon nanotubes in the bolometer film can be selected appropriately, and preferably more than 0.1% by mass or more based on the total mass of the bolometer film is effective, more preferably 1% by mass or more is effective, for example 30% by mass, and even 50% by mass or more may be preferred, and in some cases 60% by mass or more may be preferred.

An example of a method for manufacturing a carbon nanotube film is described in detail below.

A carbon nanotube film can be formed using, for example, a carbon nanotube dispersion liquid comprising carbon nanotubes and a nonionic surfactant. From the carbon nanotubes, surface functional groups and impurities such as amorphous carbon, catalysts, and the like may be removed by performing a heat treatment under an inert atmosphere, in a vacuum. The heat treatment temperature may be appropriately selected and is preferably 800 to 2000° C., and more preferably 800 to 1200° C.

The nonionic surfactant may be appropriately selected, and it is preferred to use nonionic surfactants constituted by a hydrophilic portion which is not ionized and a hydrophobic portion such as an alkyl chain, for example, nonionic surfactants having a polyethylene glycol structure exemplified by polyoxyethylene alkyl ethers, and alkyl glucoside based nonionic surfactants, singly or in combination. As such a nonionic surfactant, polyoxyethylene alkyl ether represented by Formula (1) is preferably used. In addition, the alkyl moiety may have one or a plurality of unsaturated bonds.

$$C_nH_{2n+1}(OCH_2CH_2)_mOH \quad (1)$$

wherein, n=preferably 12 to 18, and m=10 to 100, and preferably 20 to 100.

In particular, a nonionic surfactant specified by polyoxyethylene (n) alkyl ether (wherein n=20 or more and 100 or less, and the alkyl chain length is C12 or more and C18 or less) such as polyoxyethylene (23) lauryl ether, polyoxyethylene (20) cetyl ether, polyoxyethylene (20) stearyl ether, polyoxyethylene (10) oleyl ether, polyoxyethylene (10) cetyl ether, polyoxyethylene (10) stearyl ether, polyoxyethylene (20) oleyl ether, polyoxyethylene (100) stearyl ether is more preferred. In addition, N,N-bis[3-(D-gluconamido) propyl]deoxycholamide, n-dodecyl-D-maltoside, octyl-D-glucopyranoside, and digitonin may also be used.

As the nonionic surfactant, polyoxyethylene sorbitan monostearate (molecular formula: $C_{64}H_{126}O_{26}$, trade name: Tween 60, manufactured by Sigma-Aldrich, etc.), polyoxyethylene sorbitan trioleate (molecular formula: $C_{24}H_{44}O_6$, trade name: Tween 85, manufactured by Sigma-Aldrich, etc.), octylphenol ethoxylate (molecular formula: $C_{14}H_{22}O(C_2H_4O)_n$, n=1 to 10, trade name: Triton X-100, manufactured by Sigma-Aldrich, etc.), polyoxyethylene (40) isooctylphenyl ether (molecular formula: $C_8H_{17}C_6H_{40}(CH_2CH_2O)_{40}H$, trade name: Triton X-405, manufactured by Sigma-Aldrich, etc.), poloxamer (molecular formula: $C_5H_{10}O_2$, trade name: Pluronic, manufactured by Sigma-Aldrich, etc.), polyvinyl pyrrolidone (molecular formula: $(C_6H_9NO)_n$, n=5 to 100, manufactured by Sigma-Aldrich, etc.) and the like may be used.

The method for obtaining a dispersion solution of carbon nanotubes is not particularly limited, and conventionally known methods can be applied. For example, a carbon nanotube mixture, a dispersion medium, and a nonionic surfactant are mixed to prepare a solution containing carbon nanotubes, and this solution is subjected to sonication to disperse the carbon nanotubes, thereby preparing a carbon nanotube dispersion liquid (micelle dispersion solution). The dispersion medium is not particularly limited, as long as it is a solvent that allows carbon nanotubes to disperse and suspend during the separation step, and for example, water, heavy water, an organic solvent, an ionic liquid, or a mixture thereof may be used, and water and heavy water are preferred. In addition to or instead of the sonication mentioned above, a technique of dispersing carbon nanotubes by a mechanical shear force may be used. The mechanical shearing may be performed in a gas phase. In a micelle dispersion aqueous solution of the carbon nanotubes and the nonionic surfactant, the carbon nanotubes are preferably in an isolated state. Thus, if necessary, bundles, amorphous carbon, impurity catalysts, and the like may be removed using an ultracentrifugation treatment. During the dispersion treatment, the carbon nanotubes can be cut, and the length thereof can be controlled by changing the grinding conditions of the carbon nanotubes, ultrasonic output, ultrasonic treatment time, and the like. For example, the aggregate size can be controlled by grinding the untreated carbon nanotubes using tweezers, a ball mill, or the like. After these treatments, the length can be controlled to 100 nm to 5 μm using an ultrasonic homogenizer by setting the output to 40 to 600 W, optionally 100 to 550 W, 20 to 100 kHz, the treatment time to 1 to 5 hours, preferably up to 3 hours. When the treatment time is shorter than 1 hour, the carbon nanotubes may be hardly dispersible depending on the conditions, and may remain almost the original length in some cases. From the viewpoint of shortening the dispersion treatment time and reducing the cost, the treatment time is preferably 3 hours or less. The present embodiment may also have the advantage of ease of adjustment of cutting due to use of a nonionic surfactant. In addition, it has the advantage of containing no ionic surfactant which is difficult to be removed.

Dispersion and cutting of the carbon nanotubes generate a surface functional group at the surface or the end of the carbon nanotube. Functional groups such as carboxyl group, carbonyl group, and hydroxyl group are generated. When the treatment is performed in a liquid phase, a carboxyl group and a hydroxyl group are generated, and when the treatment is performed in a gas phase, a carbonyl group is generated.

The concentration of the surfactant in the liquid comprising heavy water or water and a surfactant, preferably a nonionic surfactant mentioned above is preferably from the critical micelle concentration to 10% by mass, and more preferably from the critical micelle concentration to 3% by mass. The concentration less than the critical micelle concentration is not preferred because dispersion is impossible. When the concentration is 10% by mass or less, a sufficient density of carbon nanotubes can be applied after separation, while reducing the amount of surfactant. As used herein, the critical micelle concentration (CMC) refers to the concentration serving as an inflection point of the surface tension measured by, for example, changing the concentration of an aqueous surfactant solution using a surface tensiometer such as a Wilhelmy surface tensiometer at a constant temperature. As used herein, the "critical micelle concentration" is a value under atmospheric pressure at 25° C.

The concentration of the surfactant in the liquid comprising heavy water or water and a surfactant, preferably a nonionic surfactant mentioned above is preferably from the critical micelle concentration to 10% by mass, and more preferably from the critical micelle concentration to 3% by mass. The concentration less than the critical micelle concentration is not preferred because dispersion is impossible. When the concentration is 10% by mass or less, a sufficient density of carbon nanotubes can be applied after separation, while reducing the amount of surfactant. As used herein, the critical micelle concentration (CMC) refers to the concentration serving as an inflection point of the surface tension measured by, for example, changing the concentration of an aqueous surfactant solution using a surface tensiometer such as a Wilhelmy surface tensiometer at a constant temperature. As used herein, the "critical micelle concentration" is a value under atmospheric pressure at 25° C.

The dispersion liquid obtained through the aforementioned cutting and dispersion step may be used as it is in the separation step mentioned below, or steps such as concentration and dilution may be performed before the separation step. Separation of the carbon nanotubes can be performed by, for example, the electric-field-induced layer formation method (ELF method: see, for example, K. Ihara et al. J. Phys. Chem. C. 2011, 115, 22827 to 22832 and Japanese Patent No. 5717233, which are incorporated herein by reference). One example of the separation method using the ELF method will be described. Carbon nanotubes, preferably single-walled carbon nanotubes are dispersed by a nonionic surfactant, and the dispersion liquid is put into a vertical separation apparatus, and then a voltage is applied to the electrodes arranged above and below, so that the carbon nanotubes are separated by free flow electrophoresis. The mechanism of separation can be inferred as follows for example. When the carbon nanotubes are dispersed by the nonionic surfactant, the micelle of the semiconducting carbon nanotubes has a negative zeta potential, whereas the micelle of the metallic carbon nanotubes has an opposite (positive) zeta potential (in recent years, it is considered that the metallic carbon nanotubes have a slightly negative zeta potential or are barely charged). Thus, when an electric field is applied to the carbon nanotube dispersion liquid, the micelle of the semiconducting carbon nanotubes is electrophoresed toward the anode (+) direction, and the micelle of the metallic carbon nanotubes is electrophoresed toward the cathode (−) direction by the difference between the zeta potentials, and the like. Eventually, the layer in which the semiconducting carbon nanotubes are concentrated is formed near the anode, and the layer in which the metallic carbon nanotubes are concentrated is formed near the cathode in the separation tank. The voltage for separation may be appropriately set in consideration of the composition of the dispersion medium, the charge amount of carbon nanotubes, and the like, and is preferably 1 V or more and 200 V or less, and more preferably 10 V or more and 200 V or less. It is preferably 100 V or more from the viewpoint of shortening the time for the separation step. It is preferably 200 V or less from the viewpoint of suppressing the generation of bubbles during separation and maintaining the separation efficiency. The purity is improved by repeating separation. The same separation procedure may be performed by resetting the dispersion liquid after separation to the initial concentration. As a result, the purity can be further increased.

Through the aforementioned dispersion and cutting step and separation step of the carbon nanotubes, a dispersion liquid in which the semiconducting carbon nanotubes having the desired diameter and length are concentrated can be obtained. As used herein, the carbon nanotube dispersion liquid in which semiconducting carbon nanotubes are concentrated may be referred to as the "semiconducting carbon nanotube dispersion liquid". The semiconducting carbon nanotube dispersion liquid obtained by the separation step comprises semiconducting carbon nanotubes generally 67% by mass or more, preferably 70% by mass or more, more preferably 80% by mass or more in the total amount of carbon nanotubes, and it is particularly preferably 90% by mass or more, more preferably 95% by mass or more, further preferably 99% by mass or more (the upper limit may be 100% by mass). The separation tendency of the metallic and semiconducting carbon nanotubes can be analysed by microscopic Raman spectroscopy and ultraviolet-visible near-infrared absorptiometry.

The dispersion liquid after the above cutting and dispersion step, and before the separation step may be subjected to centrifugation treatment to remove the bundles, amorphous carbon, metal impurities, and the like in the carbon nanotube dispersion liquid. The centrifugal acceleration may be appropriately adjusted, and is preferably 10000×g to 500000×g, more preferably 50000×g to 300000×g, and optionally 100000×g to 300000×g. The centrifugation time is preferably 0.5 hours to 12 hours, and more preferably 1 to 3 hours. The centrifugation temperature may be appropriately adjusted, and is preferably 4° C. to room temperature, and more preferably 10° C. to room temperature.

The concentration of the surfactant in the carbon nanotube dispersion liquid after separation may be appropriately controlled. The concentration of the surfactant in the carbon nanotube dispersion liquid is preferably from the critical micelle concentration to about 5% by mass, more preferably, 0.001% by mass to 3% by mass, and particularly preferably 0.01 to 1% by mass to suppress the reaggregation after application and the like.

A bolometer film can be formed by applying the semiconducting carbon nanotube dispersion obtained by the above-described process onto a heat insulating layer or a predetermined base material, drying it, and optionally performing heat treatment.

The method for applying the semiconducting carbon nanotube dispersion liquid to a predetermined base material (under layer 4 and the like) is not particularly limited, and examples thereof include dropping method, spin coating, printing, inkjet, spray coating, dip coating, and the like. From the viewpoint of reducing the manufacturing cost, a printing method is preferred. The printing methods can include application (dispenser, inkjet or the like), transferring (microcontact print, gravure printing, or the like) and the like.

The semiconducting carbon nanotubes dispersion liquid applied on the heat insulating layer or a desired base material may be subjected to a heat treatment to remove the surfactant and the solvent. The temperature of the heat treatment may be appropriately set as long as it is equal to or higher than the decomposition temperature of the surfactant, and it is preferably 150 to 500° C., and more preferably 200 to 500° C., for example 200 to 400° C. A temperature of 200° C. or more is preferred because the remaining of the decomposition product of the surfactant can be easily suppressed. A temperature of 500° C. or less, for example 400° C. or less is preferred because the change in the quality of the substrate or other components can be suppressed. Also, the decomposition of carbon nanotubes, the change in size, the leaving of functional groups, and the like can be suppressed.

Negative Thermal Expansion Material

In an embodiment, the bolometer films can comprise a negative thermal expansion material in addition to the carbon nanotubes.

The bolometer film according to the present embodiment is a carbon nanotube composite material in which a negative thermal expansion material is dispersed in a carbon nanotube aggregate having a three-dimensional mesh structure that forms a network structure formed of dispersed carbon nanotubes intertwined with each other into an aggregate. In such a three-dimensional electrically conductive network formed of carbon nanotubes, the carbon nanotubes are not necessarily all connected to each other to contribute to electric conductivity in the bolometer material, but part of the carbon nanotubes does not contribute to the electrical conduction mechanism. These unconnected carbon nanotubes build a new electrically conductive path resulting from the effect of reduction in the volume of the negative thermal expansion material exhibited by an increase in temperature. Or, the effect of reduction in the volume further increases the contact area between the carbon nanotubes, and moreover, the number of electrically conductive paths also increases. As a result, a larger increase in current occurs as the temperature increases, resulting in an improvement in a TCR value. That is, the negative thermal expansion material mixed with the semiconducting carbon nanotubes shrinks as the temperature rises, creating an additional network of carbon nanotubes previously separate from each other, resulting in an increase in the number of electrically conductive paths, whereby a greater amount of current flows. Furthermore, in an embodiment, using a negative thermal expansion material having resistance greater than that of the semiconducting carbon nanotubes allows more efficient formation of electrically conductive paths formed of the semiconducting carbon nanotubes.

In the present specification, the negative thermal expansion material means a material that has a negative coefficient of thermal expansion and contracts as the temperature rises. Examples of the negative thermal expansion material include a material having a coefficient of linear thermal expansion ΔL/L ((length after expansion−length before expansion)/length before expansion) per temperature difference of 1K preferably ranging from $-1\times10^{-6}$/K to $-1\times10^{-3}$/K, more preferably from $-1\times10^{-5}$/K to $-1\times10^{-3}$/K, in any temperature range from −100 to +200° C., for example, the range from −100 to +100° C., preferably in the temperature range over which the bolometer is used, for example, at least in the range from −50 to 100° C.

The coefficient of thermal expansion can be measured in accordance, for example, with JIS Z 2285 (method for measuring coefficient of linear expansion of metallic materials) or JIS R 1618 (method for measuring thermal expansion of fine ceramics based on thermo-mechanical analysis).

In an embodiment, the negative thermal expansion material is preferably a material that exhibits sufficient negative thermal expansion in the environment in which the bolometer is used. The temperatures of the environment in which the bolometer is used range, for example, from −350° C. to 100° C., preferably from −40° C. to 80° C., more preferably in some cases from 20° C. to 30° C., for example, from 21° C. to 30° C.

The humidity in the environment in which the bolometer is used, for example, in a case where the bolometer is used in a structure in which the bolometer part is exposed to the atmosphere, may be the ambient humidity, preferably, for example, 75% RH or lower. When the bolometer is vacuum-packaged or used in a structure in which the package is filled with an inert gas, the humidity is preferably, for example, 5% RH or lower, and may not fall within the range described above depending on the degree of vacuum and other factors. From the viewpoint of long-term stability of the device, lower humidity is preferable, so that the lower limit is not limited to a specific value in either case, and the humidity is 0% RH or higher, for example, higher than 0% RH.

Further, the resistivity of the negative thermal expansion material is not particularly limited. But at any temperature range from −100 to +100° C., preferably at the operating temperature of the bolometer, for example at room temperature (about 23° C.), it is preferably $10^{-1}$ Ωcm or more, optionally preferably 1 Ωcm or more, more preferably 10 Ωcm or more, even more preferably $10^{2}$ Ωcm or more, and preferably $10^{8}$ Ωcm or less, more preferably 107 Ωcm or less. Resistivity can be measured according to a standard method such as JIS K 7194 and JIS K 6911, for example.

In the present specification, the negative thermal expansion material may include oxides, nitrides, sulphides or multi-element compounds containing one or two or more of Li, Al, Fe, Ni, Co, Mn, Bi, La, Cu, Sn, Zn, V, Zr, Pb, Sm, Y, W, Si, P, Ru, Ti, Ge, Ca, Ga, Cr, Cd, but not limited thereto. A mixture of two or more compounds may be used.

The negative thermal expansion material may include, but not limited thereto, vanadium oxides, O-eucryptite, bismuth-nickel oxides, zirconium tungstate, ruthenium oxides, manganese nitrides, lead titanate, samarium monosulphide and others (including those in which one or more of the elements of these compounds have been replaced by the above elements). For example, $LiAlSiO_4$, $ZrW_2O_8$, $Zr_2WO_4(PO_4)_2$, $BiNi_{0.85}Fe_{0.15}O_3$, $Bi_{0.95}La_{0.05}NiO_3$, $Pb_{0.76}La_{0.04}Bi_{0.20}VO_3$, $Sm_{0.78}Y_{0.22}S$, $Cu_{1.8}Zn_{0.2}V_2O_7$, $Cu_2V_2O_7$, $0.4PbTiO_3$-$0.6BiFeO_3$, $MnCo_{0.98}Cr_{0.02}Ge$, $Ca_2RuO_{3.74}$, $Mn_3Ga_{0.7}Ge_{0.3}N_{0.88}C_{0.12}$, $Cd(CN)_2\cdot xCCl_4$, $LaFe_{10.5}Co_{1.0}Si_{1.5}$, $Ca_2RuO_4$, $Mn_{3.27}Zn_{0.45}Sn_{0.28}N$, $Mn_3Ga_{0.9}Sn_{0.1}N_{0.9}$, $Mn_3ZnN$ are suitable.

In one embodiment, oxides, nitrides, and sulphides are preferable among the negative thermal expansion materials, from the view point of ease of synthesis and availability.

In the present specification, the size of the negative thermal expansion material can be selected as appropriate. Preferably, it is 10 nm to 100 μm, more preferably 15 nm to 10 μm, and in some cases, it is also preferred to be from 50 nm to 5 μm.

The form of the negative thermal expansion material is not particularly limited, but may be, for example, spherical, needle, rod, plate, fibre, scale and the like, with spherical being preferred in terms of film formability.

The amount of negative thermal expansion material in the bolometer film can be selected as appropriate, but it is preferable that it is contained in an amount of 1 to 99% by mass, based on the total mass of the bolometer film, with 1 to 70% by mass being more preferable, for example, 1 to 50% by mass, in some cases 10 to 50% by mass, and optionally 40% by mass or less may also be preferred.

In addition to the carbon nanotubes and the negative thermal expansion material, the bolometer film may also comprise a binder and, if desired, other components, but it is preferred that the total mass of the carbon nanotubes and the negative thermal expansion material is 70% by mass or more, more preferably 90% by mass or more, and even more preferably 95% by mass or more, based on the mass of the bolometer film.

The bolometer film comprising carbon nanotubes and negative thermal expansion materials can be produced by using a dispersion liquid in which a carbon nanotube dispersion is added with the negative thermal expansion materials and, if necessary, binding agents and the like in the above-described method of producing a bolometer film using a carbon nanotube dispersion.

In addition to the above, in the bolometer and method for manufacturing the same of the present embodiment, the configuration and manufacturing method used in a bolometer, particularly a printed bolometer, can be employed without particular limitation, except that the entire element is protected by the resin exterior constituted by the base material layer 2 and the protective layer 9.

Back-Illuminated Bolometer Element

Figure 14:
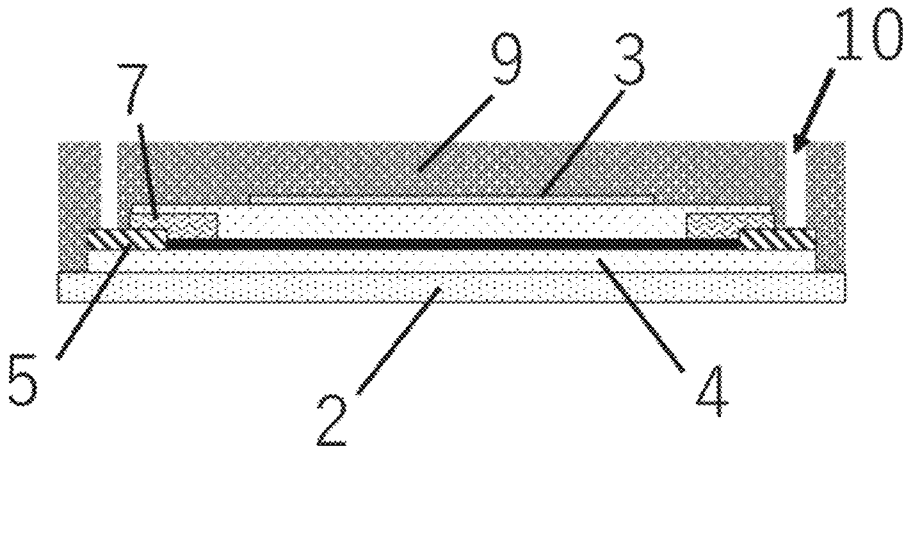
FIG. 14 is a sectional view schematically showing an example of the structure of a bolometer according to an embodiment of the present invention.

The bolometer of the present embodiment can also be a back-illuminated element because there is no non-light-transmitting base material such as a Si substrate under the base material layer 2 (FIG. 14).

In this case, in the structure of the bolometer element and the manufacturing method thereof described above, as shown in FIG. 14, as the base material layer 2, a layer corresponding to the protective layer 9, that is, a layer with high light transmittance and a thin film thickness is formed; and as the protective layer 9, a layer corresponding to the base material layer 2, that is, a layer with high heat insulation properties and a large thickness, is formed. Naturally, when a light reflecting layer or a light absorbing film is provided, the arrangement thereof may be changed as appropriate depending on the incident direction of the light to be detected.

Bolometer Array

Figure 15:
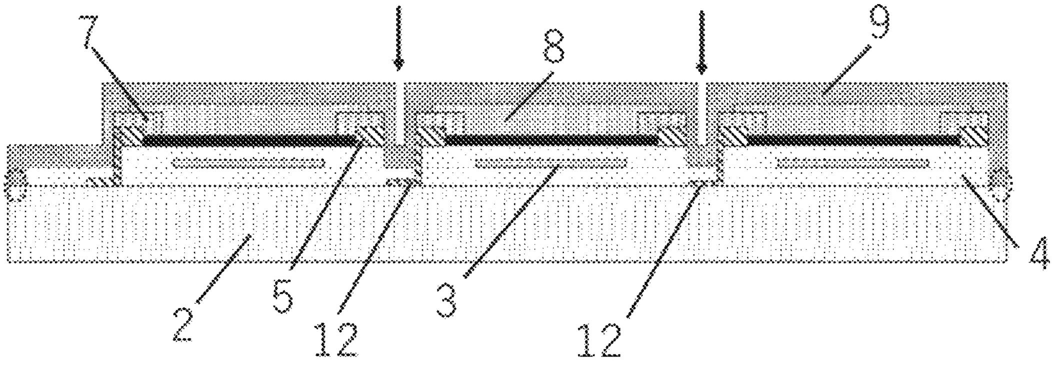
FIG. 15 is a sectional view schematically showing an example of the structure of a bolometer array according to an embodiment of the present invention.

The bolometer of the present embodiment and its manufacturing method can also be applied to a bolometer array having a plurality of elements. An example of the bolometer array according to the present embodiment is shown in FIG. 15 (cross-sectional view).

In the bolometer array of the present embodiment, the base material layer 2 and the protective layer 9 are bonded to each other at the outer peripheral portion of the array (dashed line in FIG. 15) to form a resin exterior. As a method for manufacturing such a structure, for example, in steps 9 and 10 described above, by removing the bolometer film 9 (and, if present, the under layer 4, light absorption film 8, and the like) at the outer peripheral portion of the array to expose the base material layer 2 (step 9), and then the protective layer 9 is formed (step 10). Thereby, the base material layer 2 and the protective layer 9 are bonded to each other at the outer peripheral portion of the array, forming a resin exterior that protects the entire array.

On the other hand, in the region between the elements arranged inside the array (FIG. 15, arrow part), the base material layer 2 and the protective layer 9 may be bonded to each other, or may not be bonded to each other as long as each pixel is separated at least to the depth of the bolometer film 9.

Manufacturing Method of Bolometer Array

The bolometer array of the present embodiment can be basically formed by the same manufacturing process as the single-element bolometer described above.

The manufacturing process of the bolometer array will be briefly explained.

1. A desired support 1 is provided.
2. A base material layer 2 is formed on a support 1.
3. A mirror 3 is formed for each pixel.
4. A under layer 4 is formed.
5. Wiring 5 is formed for each pixel.
6. A bolometer film 6 is formed.
7. Contact electrodes 7 are formed for each pixel.
8. A protective film/light absorption film 8 is formed.
9. The bolometer film 6 and the like at the outer periphery of the array are removed to expose the base material layer 2.
10. A protective layer 9 is formed.
11. A groove 11 for peeling off the support 1 is formed at the outermost periphery of the array.
12. The array is peeled from the support 1.

In the above process, the under layer 4, bolometer film 6, light absorption film/protective film 8, and the like may be formed for each pixel individually or formed as layers covering multiple pixels. When they are formed as layers covering multiple pixels, before step 10, for example in step 9, grooves are formed between pixels to a desired depth to separate the bolometer film 6, light absorption film/protective film 8, and the like for each pixel. The grooves can be formed by etching or the like as in step 11.

Furthermore, when the bolometer of the present embodiment is applied to a two-dimensional array, lead wires 12 and 13 are provided that are connected to the contact electrodes 7 or wires 5 of a plurality of element.

In one embodiment, the lead wires 12 and 13 may be arranged in the same layer as the bolometer film.

Further, in one embodiment, it is preferable that the lead wires 12 and 13 be arranged in a layer different from the bolometer film 6 by sandwiching an insulating layer or a heat insulating layer therebetween. This makes it possible to reduce heat flow between pixels through metal wiring and improve the accuracy of the bolometer array, compared to the case where the lead wiring and the bolometer film are present in the same layer.

An example of a method for manufacturing such a structure includes:

(1) forming lead wires (vertical wires 12 and horizontal wires 13) at different heights in the base material layer or under layer in advance;

(2) exposing the lead wiring by etching to the depth of the lead wiring in the above pixel separation process and/or forming a contact hole connected to the lead wiring; and (3) Connecting the exposed lead wiring and the contact electrode 7 or the wiring 5 using a connection electrode (connection wiring) 14 formed of titanium film or the like.

Figure 16:
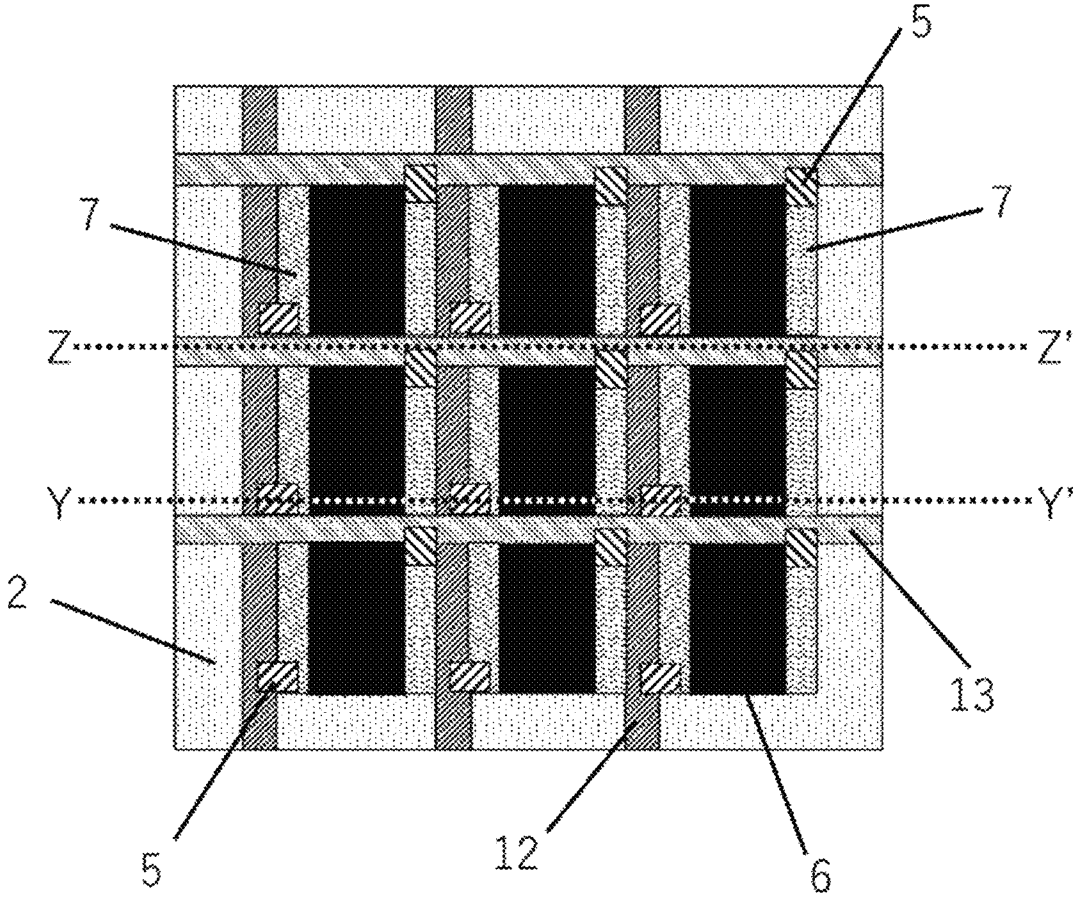
FIG. 16 is a diagram showing an example of the structure of a bolometer array according to an embodiment of the present invention (top view).
Figure 17:
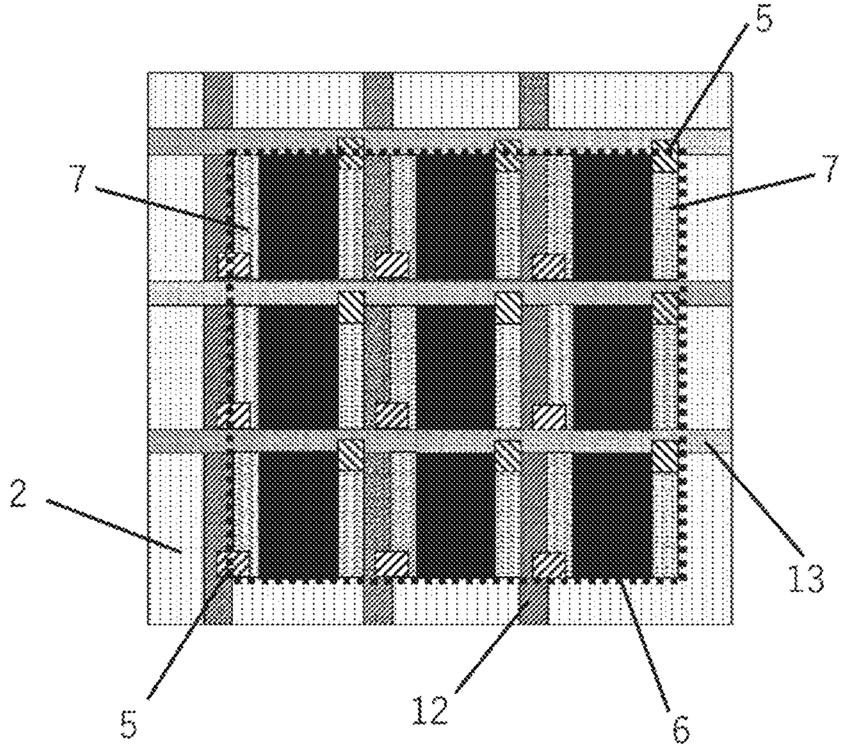
FIG. 17 is a diagram showing an example of the structure of a bolometer array according to an embodiment of the present invention (top view).
Figure 18:
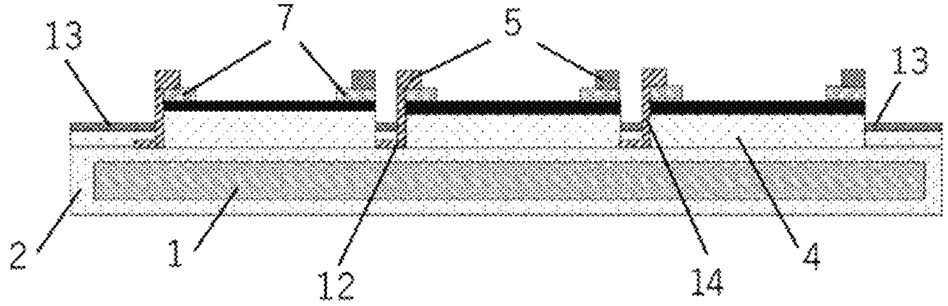
FIG. 18 is a diagram showing an example of the structure of a bolometer array according to an embodiment of the present invention (front view of cross-section at position Y-Y' of FIG. 16).
Figure 19A:
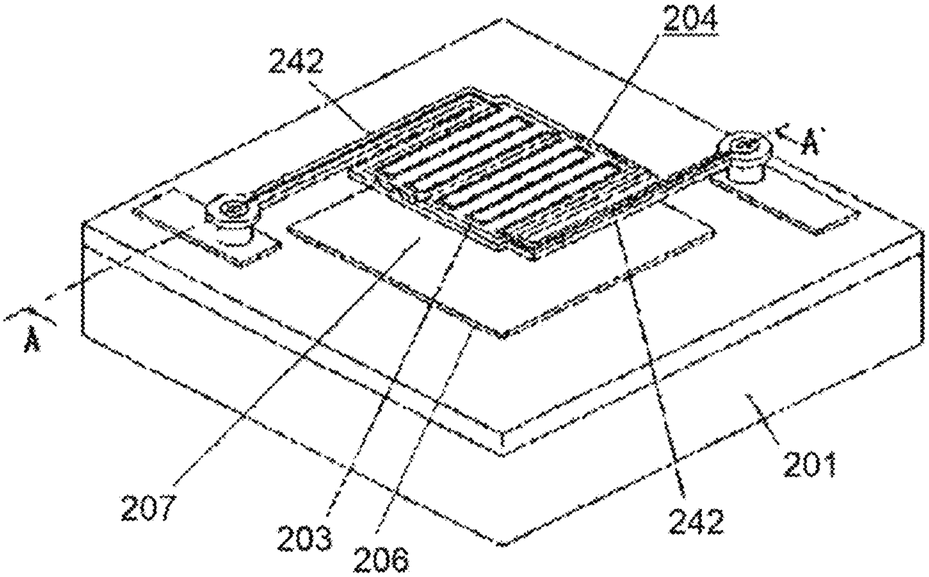
FIG. 19A is a perspective view schematically showing the structure of a conventional bolometer.
Figure 19B:
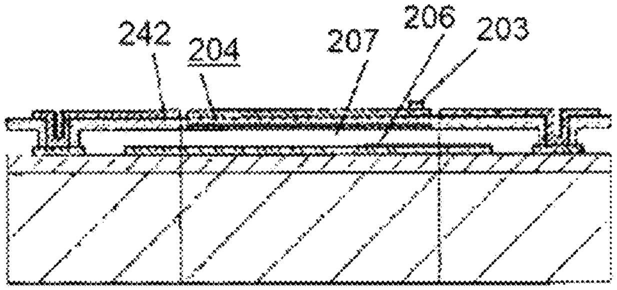
FIG. 19B is a cross-sectional view schematically showing the structure of a conventional bolometer.

FIG. 16 and FIG. 17 are top views showing the structure of the electrodes and wiring of the bolometer array according to the present embodiment. FIG. 18 is a front view when cut at the Y-Y' position in FIG. 16. As shown in this front view, the vertical wiring 12 and the horizontal wiring 13 (horizontal wiring 13 provided at the Z-Z' position in FIG. 16) may be arranged in different layers with an insulating layer therebetween.

In order to clearly show the positional relationship, FIGS. 16, 17, and 18 show an embodiment in which the wiring 5 is provided upper side the contact electrodes 7. Further, for convenience, some components such as the mirror 3 and the light absorption film 8 on the bolometer film 6 are omitted.

After forming the electrodes and wiring in this way, or at the same time as the etching step (2) above, the bolometer film 9 (and, if present, the under layer 4, light absorption film 8, and the like) on the outer periphery of the array is removed to expose the base material layer 2, and then, a protective layer 9 is formed in the same manner as in the case of a single element. Thereafter, a groove 11 is formed at the outermost of planed periphery of the array, and the array according to the present embodiment is peeled off from the support 1. This makes it possible to form an array in which a plurality of elements are enclosed and protected by a resin exterior formed of the base material layer 2 and the protective layer 9.

In the present embodiment, the outer peripheral portion of the array refers to a region outside the outer edge (dashed line portion in FIG. 17) of the light detection section of the elements arranged on the outside among the plurality of elements constituting the array.

In addition, when providing lead wires, it is preferable that the opening for these lead wires (the area where the lead wires penetrate the resin exterior) is 1/10 or less of the surface area of the resin exterior.

An example of a manufacturing process for manufacturing the array according to the present embodiment will be briefly described.

(1) A desired support 1 is provided.
(2) A base material layer 2 is formed on the support 1.
(3) Vertical wirings 12 are formed on the base material layer 2.
(4) A under layer 4 is formed.
(5) Mirrors 3 for each pixel and horizontal wirings 13 are formed on the under layer 4.
(6) A under layer 4 is formed.
(7) Wirings 5 are formed for each pixel.
(8) A bolometer film 6 is formed.
(9) Contact electrodes 7 are formed for each pixel.
(10) A protective film/light absorption film 8 is formed.
(11) The bolometer film and the like between pixels are removed by etching or the like to expose the wirings 5, vertical wiring 12, and horizontal wiring 13, and the wirings 5 of pixels are connected to the vertical wiring 12, and horizontal wirings 13 through connection wirings 14.
(12) The bolometer film 6 and the like at the outer periphery of the array are removed to expose the base material layer 2.
(13) A protective layer 9 is formed.
(14) A groove 11 for peeling off the support 1 is formed at the outermost periphery of the array.
(15) The array is peeled from the support 1.

When the bolometer of the present embodiment is applied to a bolometer array, the configuration generally used for a bolometer array can be used without particular restriction, except for forming the resin exterior by the combination of the base material layer 2 and the protective layer 9.

For example, although a simple matrix type bolometer type detector is shown above, the bolometer type detector of the present embodiment may be an active matrix type array such as a TFT (thin film transistor) array.

While the present disclosure has been particularly shown and described with reference to example embodiments thereof, the present disclosure is not limited to these example embodiments. It will be understood by those of ordinary skill in the art that various changes in form and details may be made therein without departing from the spirit and scope of the present disclosure as defined by the claims. And each embodiment can be appropriately combined with other embodiments. embodiments.

Some or all of the above embodiments may also be described as in the Supplementary notes below, but the disclosures of the present application are not limited to the appendix below.

Supplementary Note 1

A bolometer comprising
(a) a light detection section including a bolometer film, and
(b) a resin exterior enclosing the light detection section; the resin exterior including (b1) a base material layer formed of a resin having a thermal conductivity of 0.3 W/mK or less, and (b2) a protective layer formed of a resin having a thermal conductivity of 0.3 W/mK or less and an infrared transmittance of 70% or more.

Supplementary Note 2

The bolometer according to Supplementary note 1, wherein the base material layer has a thickness of 100 nm or more and 200 μm or less.

Supplementary Note 3

The bolometer according to Supplementary note 1 or 2, wherein the protective layer has a thickness of 10 nm or more and 100 μm or less.

Supplementary Note 4

The bolometer according to Supplementary notes 1 to 3, wherein the base material layer and the protective layer are formed of a same resin.

Supplementary Note 5

The bolometer according to any one of Supplementary notes 1 to 4, wherein the base material layer has such a bending resistance that no cracking appears even when bent to a radius of curvature of 10 mm at room temperature (23° C.).

Supplementary Note 6

The bolometer according to any one of Supplementary notes 1 to 5, further comprising a under layer on the base material layer.

Supplementary Note 7

The bolometer according to any one of Supplementary notes 1 to 6, wherein a resin forming the base material layer is parylene.

Supplementary Note 8

The bolometer according to any one of Supplementary notes 1 to 7, wherein a resin forming the base material layer and the protective layer is parylene.

Supplementary Note 9

The bolometer according to any one of Supplementary notes 1 to 8, wherein the bolometer film comprises an organic material.

Supplementary Note 10

The bolometer according to any one of Supplementary notes 1 to 9, wherein the bolometer film comprises an organic material.

Supplementary Note 11

The bolometer according to any one of Supplementary notes 1 to 10, which has an array structure, the bolometer comprising (a) a plurality of light detection section each including a bolometer film, and (b) a resin exterior enclosing the plurality of light detection section; the resin exterior including (b1) a base material layer formed of a resin having a thermal conductivity of 0.3 W/mK or less, and (b2) a protective layer formed of a resin having a thermal conductivity of 0.3 W/mK or less and an infrared transmittance of 70% or more.

Supplementary Note 12

A method of manufacturing a bolometer comprising:

forming a base material layer by a resin having a thermal conductivity of 0.3 W/mK or less;

forming a bolometer film on the base material layer;

forming two electrodes so as to be connected to the bolometer film to form a light detection section including the bolometer film and the electrodes;

forming a protective layer having a thermal conductivity of 0.3 W/mK or less and an infrared transmittance of 70% or more in such a manner that the protective layer covers the light detection section and bonds directly to the base material layer around the light detection section, whereby the base material layer and the protective layer together form a resin exterior enclosing the light detection section.

Supplementary Note 13

A method of manufacturing a bolometer according to claim 9 comprising:

forming a base material layer by a resin having a thermal conductivity of 0.3 W/mK or less on a support;

forming an under layer on the base material layer;

forming a bolometer film on the under layer;

forming two electrodes so as to be connected to the bolometer film to form a light detection section including the bolometer film and the electrodes; and forming a protective layer having a thermal conductivity of 0.3 W/mK or less and an infrared transmittance of 70% or more in such a manner that the protective layer covers the light detection section and bonds directly to the base material layer around the light detection section, whereby the base material layer and the protective layer together form a resin exterior enclosing the light detection section;

forming a groove outside of the outer periphery of the light detection part to the depth of the surface of the support; and separating from the support the light detection section enclosed by the resin exterior comprising the base material layer and the protective layer.

Supplementary Note 14

The method of manufacturing a bolometer according to Supplementary note 12 or 13, further comprising forming a contact hole connected to the two electrodes after forming the protective layer.

Supplementary Note 15

The method of manufacturing a bolometer to any one of Supplementary notes 12 to 14, further comprising forming a mirror on a side opposite to a incident side of light to be detected taking the bolometer film as a reference plane.

Supplementary Note 16

The method of manufacturing a bolometer to any one of Supplementary notes 12 to 15, further comprising forming a mirror on an incident side of light to be detected taking the bolometer film as a reference plane.

Supplementary Note 17

The bolometer according to any one of Supplementary notes 1 to 11, wherein the resin exterior has one or more contact holes for electrically connecting the light detection section to one or more wirings outside of the bolometer.

Supplementary Note 18

The bolometer according to Supplementary note 17, wherein the resin exterior has an inner space formed by the base material layer and the protective layer; the inner space being a closed space having one or more openings only of the contact hole(s).

Supplementary Note 19

The bolometer according to Supplementary note 18, wherein a total area of the contact holes is 1/10 or less of the entire surface of the resin exterior.

Supplementary Note 20

The bolometer according to Supplementary note 17, wherein the resin exterior has an inner space formed by the base material layer and the protective layer; the inner space being a closed space having one or more openings of the contact hole(s) and another opening other than the contact hole(s), and wherein a total area of the opening(s) is 1/10 or less of the entire surface of the resin exterior.

EXPLANATION OF REFERENCE

1 Support (Si substrate)
2 Base material layer (parylene layer)
3 Light reflection layer (mirror)
4 Under layer ($SiO_2$)
5 Wiring (Ti/Au)
6 Bolometer film (carbon nanotube film)
7 Contact electrode
8 Light absorption film/protective film ($SiO_2$ or SiN)
9 Protective layer (parylene film)
10 Contact hole
11 Groove
12 Vertical wire
13 Horizontal wire
14 Connection Wiring
201 Silicon substrate
203 Heat detection section
204 Heat insulating layer
206 Light reflection layer (infrared reflection layer)
207 Gap
242 Leg

The invention claimed is:

1. A bolometer comprising (a) a light detector including a bolometer film, and (b) a resin exterior enclosing the light detector; the resin exterior including (b1) a base material layer formed of a resin having a thermal conductivity of 0.3 W/mK or less, and (b2) a protective layer formed of a resin having a thermal conductivity of 0.3 W/mK or less and an infrared transmittance of 70% or more, wherein the base material layer is not supported by a support formed of an inorganic or organic material.

2. The bolometer according to claim 1, wherein the base material layer has a thickness of 100 nm or more and 200 μm or less.

3. The bolometer according to claim 1, wherein the protective layer has a thickness of 10 nm or more and 100 μm or less.

4. The bolometer according to claim 1, wherein the base material layer and the protective layer are formed of a same resin.

5. The bolometer according to claim 1, wherein a resin forming the base material layer is parylene.

6. The bolometer according to claim 1, wherein a resin forming the base material layer and the protective layer is parylene.

7. The bolometer according to claim 1, wherein the bolometer film comprises semiconducting carbon nanotubes.

8. The bolometer according to claim 1, which has an array structure, the bolometer comprising (a) a plurality of light detector each including a bolometer film, and (b) a resin exterior enclosing the plurality of light detector; the resin exterior including (b1) a base material layer formed of a resin having a thermal conductivity of 0.3 W/mK or less, and (b2) a protective layer formed of a resin having a thermal conductivity of 0.3 W/mK or less and an infrared transmittance of 70% or more.

9. The bolometer according to claim 1, wherein the bolometer film is formed on and in direct contact with an under layer formed of silicon oxide and/or silicon nitride, and the bolometer film is covered by a light absorption film which functions as a protective film formed of silicon oxide and/or silicon nitride.

10. A method of manufacturing a bolometer comprising:

forming a base material layer by a resin having a thermal conductivity of 0.3 W/mK or less on a support;

forming an under layer on the base material layer;

forming a bolometer film on the under layer;

forming two electrodes so as to be connected to the bolometer film to form a light detector including the bolometer film and the electrodes; and forming a protective layer having a thermal conductivity of 0.3 W/mK or less and an infrared transmittance of 70% or more in such a manner that the protective layer covers the light detector and bonds directly to the base material layer around the light detector, whereby the base material layer and the protective layer together form a resin exterior enclosing the light detector;

forming a groove outside of the outer periphery of the light detection part to the depth of the surface of the support; and separating from the support the light detector enclosed by the resin exterior comprising the base material layer and the protective layer.

* * * * *